(12) United States Patent
Satpathy et al.

(10) Patent No.: US 10,135,463 B1
(45) Date of Patent: Nov. 20, 2018

(54) METHOD AND APPARATUS FOR ACCELERATING CANONICAL HUFFMAN ENCODING

(71) Applicant: Intel Corporation, Santa Clara, CA (US)

(72) Inventors: Sudhir K. Satpathy, Hillsboro, OR (US); James D. Guilford, Northborough, MA (US); Vinodh Gopal, Westborough, MA (US); Kirk S. Yap, WestBorough, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,343

(22) Filed: Sep. 29, 2017

(51) Int. Cl.
  *H03M 7/30* (2006.01)
  *H03M 7/40* (2006.01)

(52) U.S. Cl.
  CPC .......... *H03M 7/6017* (2013.01); *H03M 7/40* (2013.01); *H03M 7/6023* (2013.01)

(58) Field of Classification Search
  None
  See application file for complete search history.

(56) References Cited

U.S. PATENT DOCUMENTS

| | | | | |
|---|---|---|---|---|
| 6,121,903 A | * | 9/2000 | Kalkstein | H03M 7/3086 341/106 |
| 9,509,336 B1 | * | 11/2016 | Henry | H03M 7/30 |
| 9,509,337 B1 | * | 11/2016 | Henry | H03M 7/3086 |

OTHER PUBLICATIONS

Klein, Shmuel et al. Huffman Coding with Non-Sorted Frequencies, Springer Link, Mathematics in Computer Science, Jun. 2011, vol. 5, Issue 2, pp. 171-178.*
Matai, Janarbek et al., Energy Efficient Canonical Huffman Encoding, Jul. 2014, IEEE, Application-specific Systems, Architectures and Processors (ASAP), 2014 IEEE 25th International Conference on.*
Alakuijala, J., et al., "Brotli Compressed Data Format", Internet Engineering Task Force (ITEF), Jul. 2016, 128 pages.
Deutsch, P., et al., "RFC 1951—DEFLATE Compressed Data Format Specification version 1.3", Network Working Group, May 1996, accessed at: http://www.faqs.org/rfcs/rfc1951.html, 15 pages.
Huffman, David A., "A Method for the Construction of Minimum-Redundancy Codes", Proceedings of the IRE, vol. 40, Issue 9, Sep. 1952, pp. 1098-1101.
Ziv, Jacob, et al., "A Universal Algorithm for Sequential Data Compression", IEEE Transactions on Information Theory, vol. IT-23, No. 3, May 1977, pp. 337-343.

* cited by examiner

*Primary Examiner* — Howard Williams
(74) *Attorney, Agent, or Firm* — Alliance IP, LLC

(57) ABSTRACT

In one embodiment, an apparatus comprises a memory; and a compression engine comprising circuitry, the compression engine to assign weights to a plurality of first symbols of a data set, a weight representing a frequency of a corresponding first symbol in the data set; perform a partial sort of the first symbols based on the assigned weights; generate at least a portion of a Huffman tree based on the partial sort; and create a plurality of Huffman codes for the plurality of first symbols based on the Huffman tree.

23 Claims, 16 Drawing Sheets

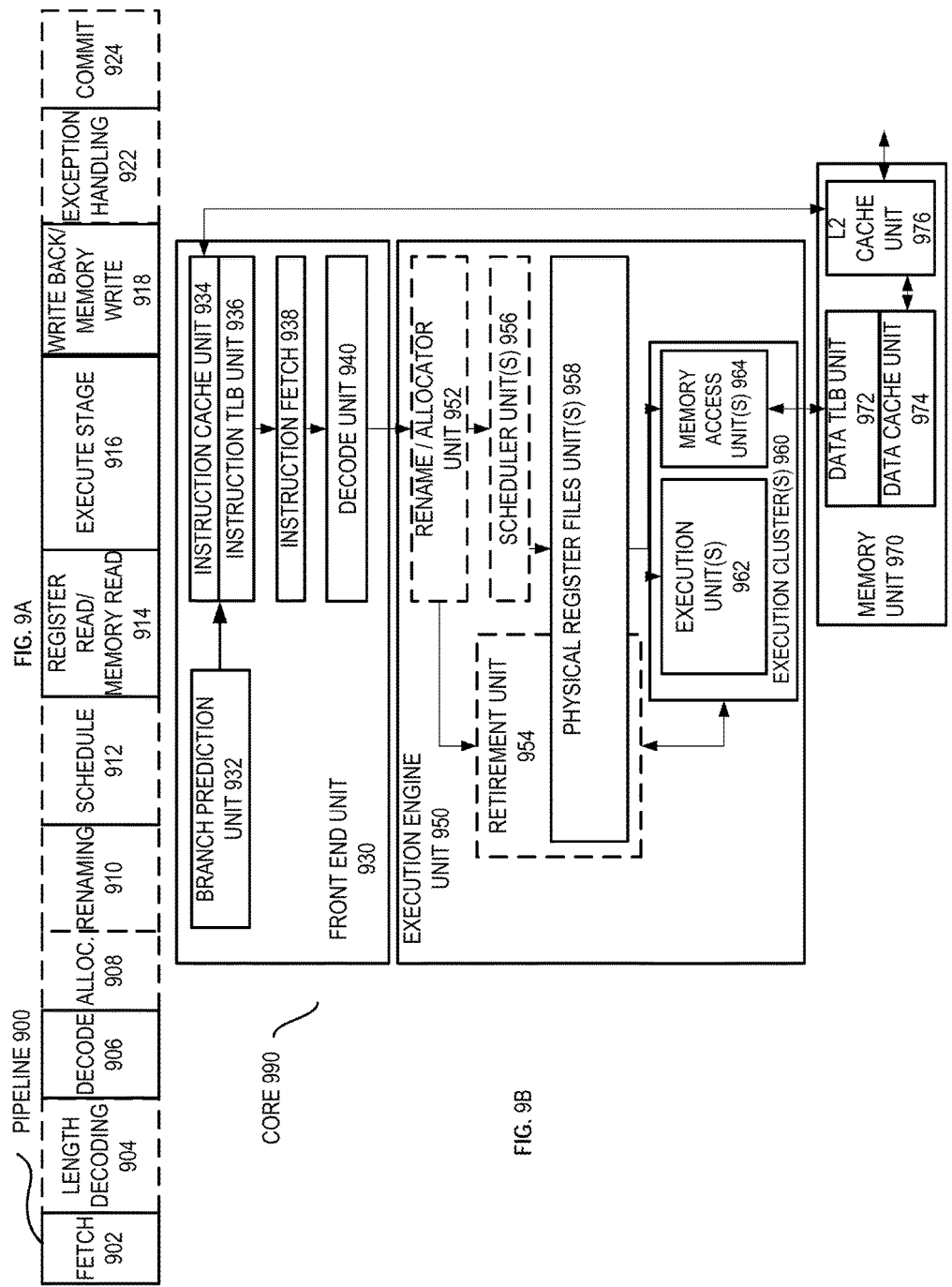

100 B1

METHOD AND APPARATUS FOR ACCELERATING CANONICAL HUFFMAN ENCODING

FIELD

The present disclosure relates in general to the field of computer development, and more specifically, to data compression.

BACKGROUND

A computing system may include one or more processors, one or more memory devices, and/or one or more communication controllers, among other components. The computing system may be operable to access and compress a data set.

BRIEF DESCRIPTION OF THE DRAWINGS

FIG. 9A is a block diagram illustrating both an exemplary in-order pipeline and an exemplary register renaming, out-of-order issue/execution pipeline in accordance with certain embodiments.

FIG. 9B is a block diagram illustrating both an exemplary embodiment of an in-order architecture core and an exemplary register renaming, out-of-order issue/execution architecture core to be included in a processor in accordance with certain embodiments;

Like reference numbers and designations in the various drawings indicate like elements.

DETAILED DESCRIPTION

Figure 1:
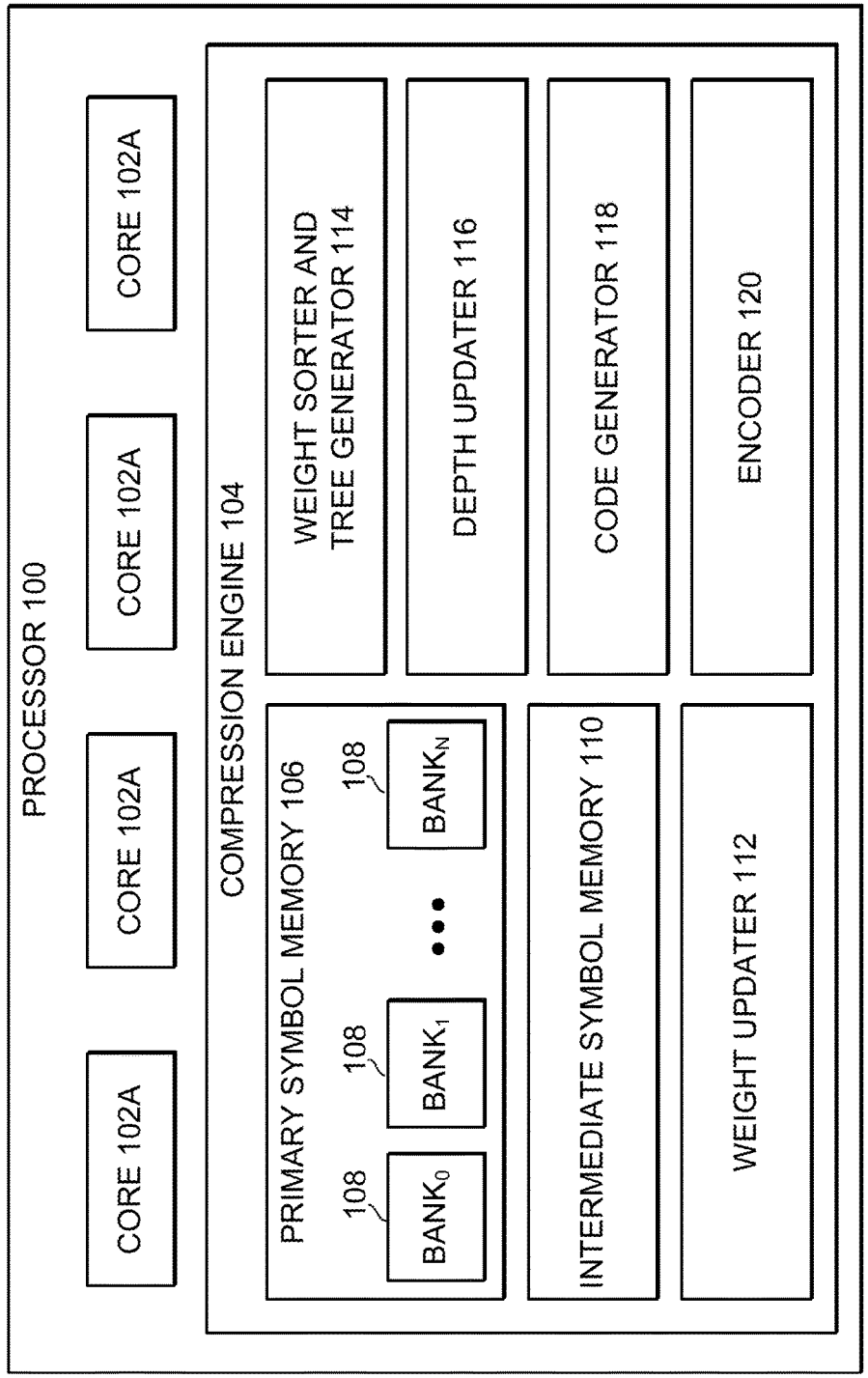
FIG. 1 illustrates a block diagram of an example processor comprising a plurality of cores and a compression engine in accordance with certain embodiments.

FIG. 1 illustrates a block diagram of an example processor 100 comprising a plurality of cores 102A-D and a compression engine 104 in accordance with certain embodiments. Processor 100 may also include any other suitable components. Compression engine 104 may provide compression acceleration according to various embodiments described herein.

Canonical Huffman encoding (CHE) is a key performance critical step in various lossless data compression schemes. In contrast to pattern matching, LZ77 encoding, token transcoding, or other steps that can be accelerated using parallelization techniques with additional hardware, Huffman encoding involves operations that are serially dependent, leading to performance bottlenecking. Moreover, emerging standards such as the Brotli compression standard rely on multiple Huffman trees to optimally compress a given set of symbols by adaptively switching contexts within a compressed data block, as opposed to generic standards like DEFLATE that use a single Huffman tree within a block. The serial bottleneck in CHE is exacerbated under such scenarios, limiting overall compression throughput. Furthermore, compression techniques are becoming increasingly popular in many new applications such as field programmable gate array (FPGA) configuration, firmware storage, Internet of Things (IoT) communication, or other applications where packet sizes tend to be small (for example, a few kilobytes (KB)). In most situations, CHE latency is agnostic to payload size and only depends on the number of unique symbols in a payload. As such, it is important to reduce CHE latency for such small payloads. In many scenarios, Huffman encoding is also used as a stand-alone feature for error detection/correction and light-weight lossless compression. For example, a converged security engine that accelerates crypto processing (e.g., in an uncore) may leverage Huffman encoding to reduce a firmware footprint. However, because of the long latency incurred for CHE, such applications may be limited to using static Huffman codes despite the superior compression ratio of dynamic Huffman encoding.

Conventional Huffman encoding schemes incur significant latency for sorting symbol weights and subsequently process the sorted symbols to generate a Huffman tree data structure comprising the original symbols and new intermediate symbols. Sorting and tree generation latencies increase super-linearly with the number of participating symbols, rendering this approach suboptimal for large number of tokens.

In various embodiments of the present disclosure, a compression engine 104 may overlap Huffman tree generation with the sorting operation, allowing the two operations to proceed concurrently, rather than beginning the Huffman tree generation after sorting is completed, significantly reducing compression latency. Following tree generation, a partially sorted symbol data structure is leveraged to compute Huffman codes of existing symbols by opportunistically skipping symbols that do not exist in the data set being compressed. Various embodiments of the present disclosure reduce a logic footprint by reusing the weight sorting hardware for code generation, as well as speeding up transcoding and overall compression throughput by eliminating idle cycles normally lost to processing non-existent symbols. Various embodiments may be useful in accelerating compression of small payloads that do not include all permissible symbols. Various techniques may significantly reduce CHE latency.

In the embodiment of FIG. 1, a single compression engine 104 is shared by all of the cores 102. In an alternate embodiment, each core includes its own instance (or multiple instances) of a compression engine 104. In yet another embodiment, the compression engine 104 may be implemented on a semiconductor chip separate from the semiconductor chip of the processor 100 and may be communicatively coupled to the processor over a communication link/bus. The underlying principles of the present disclosure are not limited to any particular architectural arrangement for integrating the compression engine 104 into a computer system. In various embodiments, compression engine 104 or any component thereof (e.g., the weight sorter and tree generator 114) may be implemented in any suitable logic, such as hardware and/or in a programmable platform such as an FPGA or firmware.

Compression engine 104 includes a primary symbol memory 106 comprising a plurality of banks 108, an intermediate symbol memory 110, weight updater 112, weight sorter and tree generator 114, depth updater 116, code generator 118, and encoder 120. Each of these components are described below in connection with FIGS. 2-7. In various embodiments, two or more of these blocks depicted may utilize common hardware (e.g., circuitry). For example, two or more of the blocks may share one or more arithmetic logic units (ALU)s or other blocks of circuitry. Thus, in some embodiments, one or more blocks may overlap with one or more other blocks.

Figure 2:
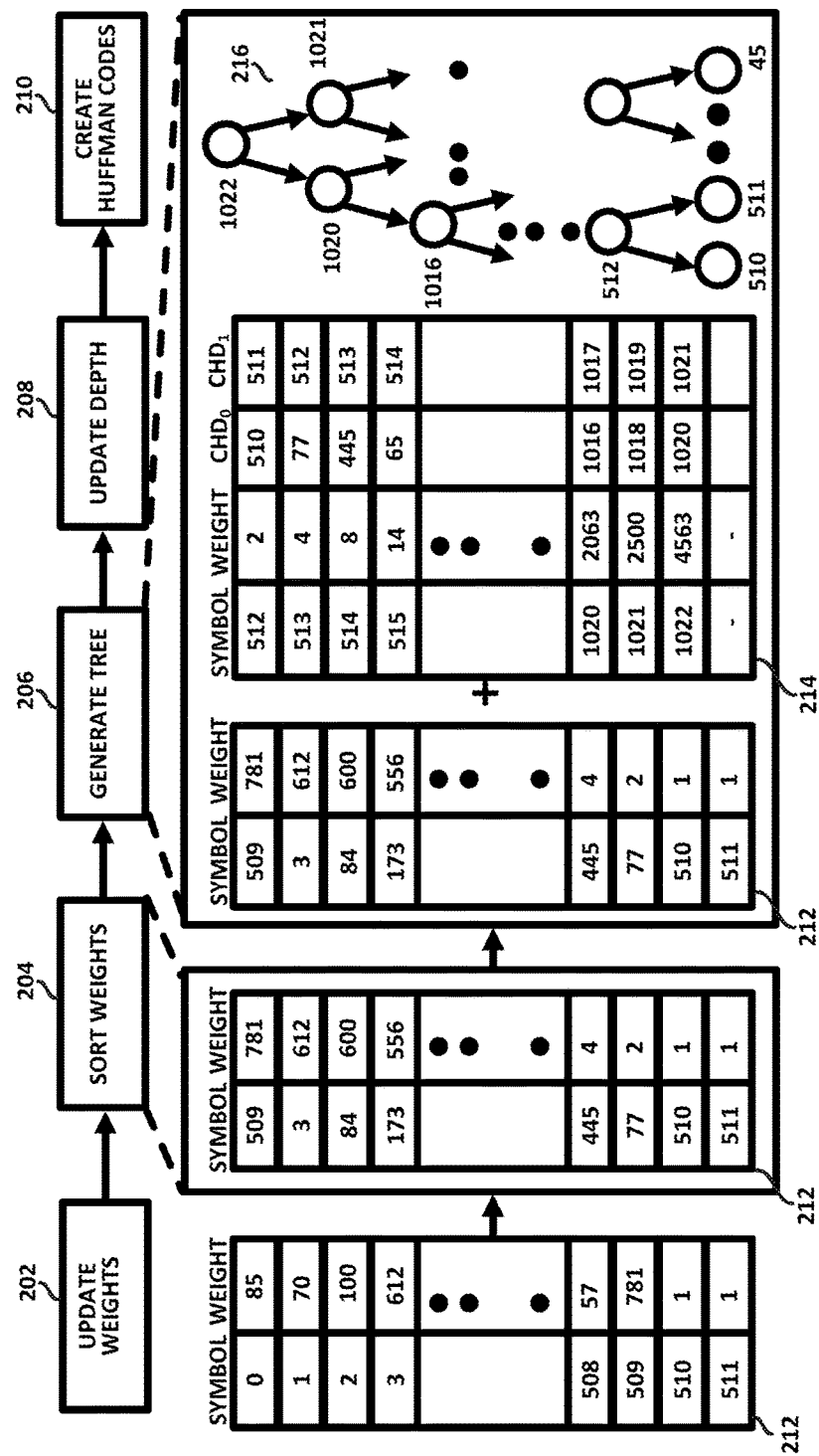
FIG. 2 illustrates a first portion of an example flow for generating Huffman codes in accordance with certain embodiments.

FIG. 2 illustrates a first portion of an example flow for generating Huffman codes in accordance with certain embodiments. Huffman encoding includes generating variable length codes for symbols of a data set, wherein the codes have lengths that are inversely proportional to the weights (i.e., frequency of occurrence) of their corresponding symbols. The flow depicted includes an update weights operation 202, a sort weights operation 204, a generate tree operation 206, an update depth operation 208, and a create Huffman codes operation at 210. In various embodiments, weight updater 112 performs the update weights operation 202, weight sorter and tree generator 114 performs the sort weights operation 204 as well as the generate tree operation 206, depth updater 116 performs update depth operation 208, and code generator 118 performs the create Huffman codes operation 210. Once operations 202, 204, 206, 208, and 210 have been completed, encoder 120 may generate encoded data by replacing symbols of a data set with the generated Huffman codes.

Figure 3:
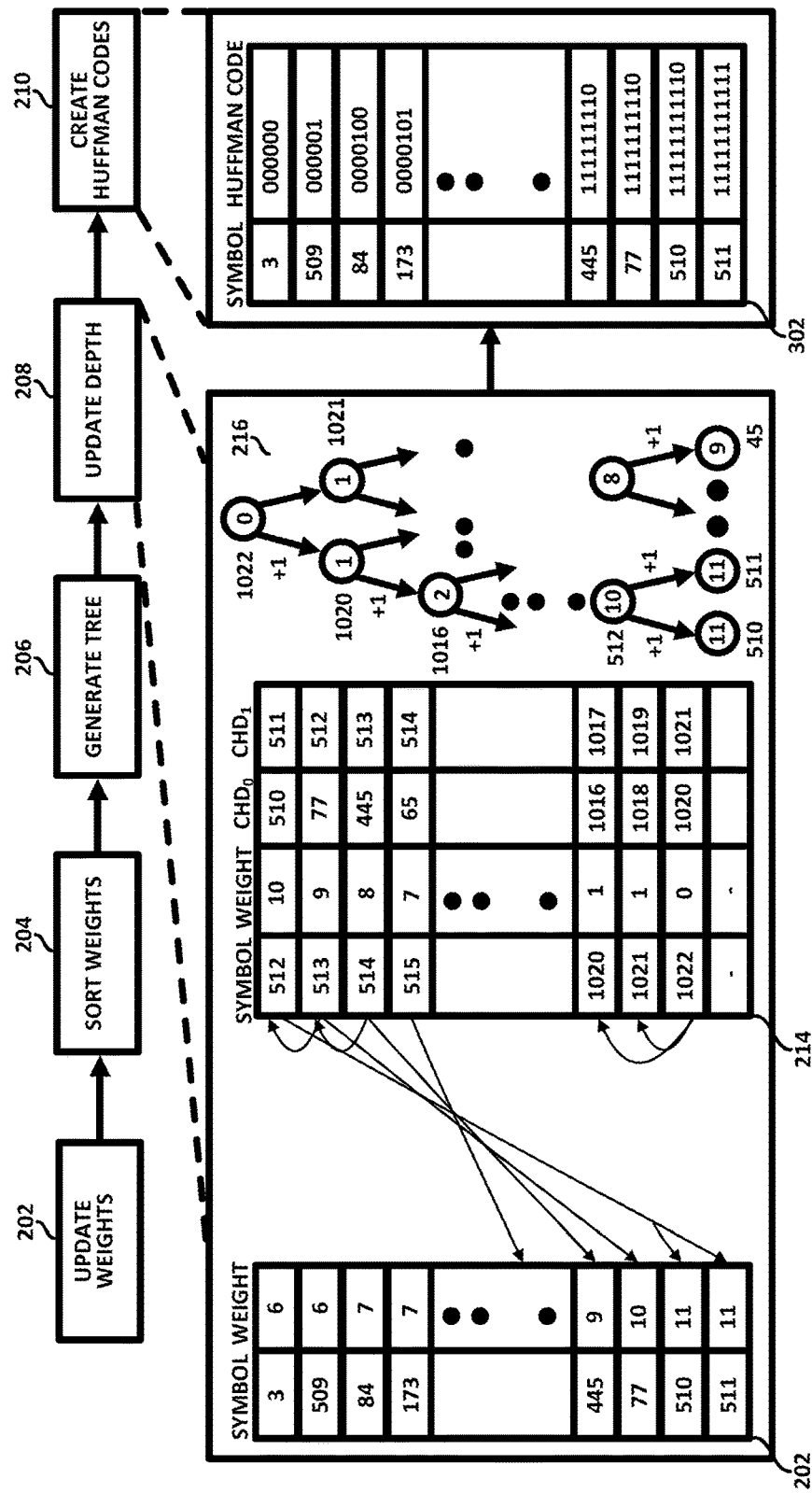
FIG. 3 illustrates a second portion of an example flow for generating Huffman codes in accordance with certain embodiments.

For the purposes of explanation, compression of a data set with a maximum of 512 unique symbols is assumed, though compression engine 104 may compress data sets with any suitable number of possible unique symbols (and the various configurations illustrated in the following figures may be adapted according to the number of symbols). FIGS. 2 and 3 represent a conceptual flow for creating Huffman codes (though various elements depicted, such as table 214, may be included in particular embodiments). In various embodiments, the performance of various operations (e.g., operations 204, 206, and 208) may be performed in a novel manner as described herein to accomplish the results of the conceptual flow depicted in FIGS. 2 and 3.

During the update weights operation 202, the data set to be compressed is analyzed to determine the weight (e.g., number of occurrences) of each symbol in the data set. In the embodiment depicted, symbol 0 has a weight of 85 (e.g., was found 85 times in the data set), symbol 1 has a weight of 70, symbol 2 has a weight of 100, and so on. The symbol numbers and corresponding weights are stored in a table 212 (e.g., primary symbol memory 106 may implement such a table). In various embodiments, a symbol number may correspond to the symbol's initial index in primary symbol memory 106 or table 212. In particular embodiments, the symbol numbers may be assigned according to the particular encoding scheme being used and the symbols corresponding to the symbol numbers are known to the compression engine as well as the entity decompressing the compressed stream. As just one example, in a particular compression scheme, the string "A" may correspond to symbol 0, the string "B" may correspond to symbol 1, and so on.

During the sort weights operation 204, the symbols are sorted based on their weights. For example, the symbol number with the highest weight may occupy the first entry of table 212 and the symbol number with the lowest weight may occupy the last entry of table 212. Sorting the symbols by weight generally involves many comparison and data shuffle operations that are serially dependent on prior comparison results that are difficult to predict. As will be explained in FIGS. 4 and 5, in various embodiments, the sort depicted in FIG. 2 is implemented in parallel with the generate tree operation 206 by storing the symbol numbers among a plurality of banks of primary symbol memory 106 and performing a partial sort of the symbol numbers by sorting the weights within each bank, as opposed to conventional methods in which the sorting of the entire table 212 is completed before the generate tree operation 206 begins. In a particular embodiment, the sorted weights and symbol numbers may be stored in the same table (which in some embodiments may include a memory with a plurality of banks) as the unsorted weights and symbol numbers (that is, the symbol numbers and weights may be rearranged within a table during the sort weights operation 204).

During the generate tree operation 206, a Huffman tree 216 is generated. The tree generation operation creates new intermediate symbols (i.e., symbols 512-1022 in the depicted embodiment) with corresponding weights that are again sorted (against other intermediate symbols and the primary symbols, i.e., the symbols corresponding to indices 0-511) before the next symbol of the Huffman tree is generated. In contrast to other operations, the sort weights operation 204 and the generate tree operation 206 (when performed in a conventional manner) incur latency that increases super-linearly with the number of symbols, therefore primarily determining overall code generation latency.

The Huffman tree 216 is generated by searching all of the symbols (i.e., both intermediate symbols and initial symbols that have not been placed into the tree yet) for the two symbols having the lowest weights. For example, in the embodiment depicted, before any intermediate symbols are generated, the two symbols having the lowest weights are symbol 510 and symbol 511, which each have a weight of 1. An intermediate symbol 512 is created that is the parent symbol of the two symbols with the lowest weights. A weight (2 in this case) that is equal to the sum of the children symbols is assigned to the intermediate symbol. In various embodiments of the present disclosure, the number of the intermediate symbol is added to a table 214 (e.g., which may be implemented in intermediate symbol memory 110) along with an indication of the intermediate symbol's weight and its left (i.e., symbol 510) and right (i.e., symbol 511) children (i.e., chd0 and chd1). This intermediate symbol is now included and the two children symbols are excluded (as they are considered to have been placed in the tree) from the set of symbols considered during the next search for the two symbols with minimum weights. The next round of operations also includes searching for the two symbols with the lowest weights (the searched symbols may include primary symbols and intermediate symbols) and assigning them as children to a new intermediate symbol which is created in the same manner as described above. This process repeats until the set of symbols to be searched includes only a single symbol. This remaining symbol (1022 in this case) is assigned as the root symbol of the Huffman tree 216. FIG. 2 depicts (a portion of) the intermediate symbols that are generated as well as a portion of the resulting Huffman tree 216 (which is represented by the data in table 214).

FIG. 3 illustrates a second portion of an example flow for generating Huffman codes in accordance with certain embodiments. After the Huffman tree is generated, an update depth operation 208 is performed in which a depth of each symbol is updated based on the symbol's level within the Huffman tree 216. The root symbol (symbol 1022 in the depicted embodiment) is assigned a depth of 0 and the depth is incremented by 1 for each level that is traversed to reach a particular symbol. Thus, symbols 1020 and 1021 are each assigned a depth of 1, symbol 1016 is assigned a depth of 2, symbol 512 is assigned a depth of 10, and symbols 510 and 511 are assigned a depth of 11. In a particular embodiment, the depth values are stored in memory elements that previously held the weights of the various indices (since the weights are no longer needed once the Huffman tree is generated). For example, the depth values may be stored in primary symbol memory 106 (e.g., in a plurality of banks) and intermediate symbol memory 110 (e.g., table 214). The depth value of a symbol corresponds to the length of a Huffman code that will be generated for the symbol. In various embodiments, the number of primary symbols assigned to each depth is recorded. For example, the number of primary symbols assigned to depth 1 is stored, the number of primary symbols assigned to depth 2 is stored, and so on.

During the create Huffman codes operation at 210, Huffman codes are generated for each primary symbol. A starting code for each code length (i.e., depth) may be determined based on the number of primary symbols assigned to each depth. The symbols are then iterated through and assigned Huffman codes based on their code lengths. After the Huffman codes are generated, encoder 120 encodes a data block by replacing symbols of the data block with the Huffman codes.

Figure 4:
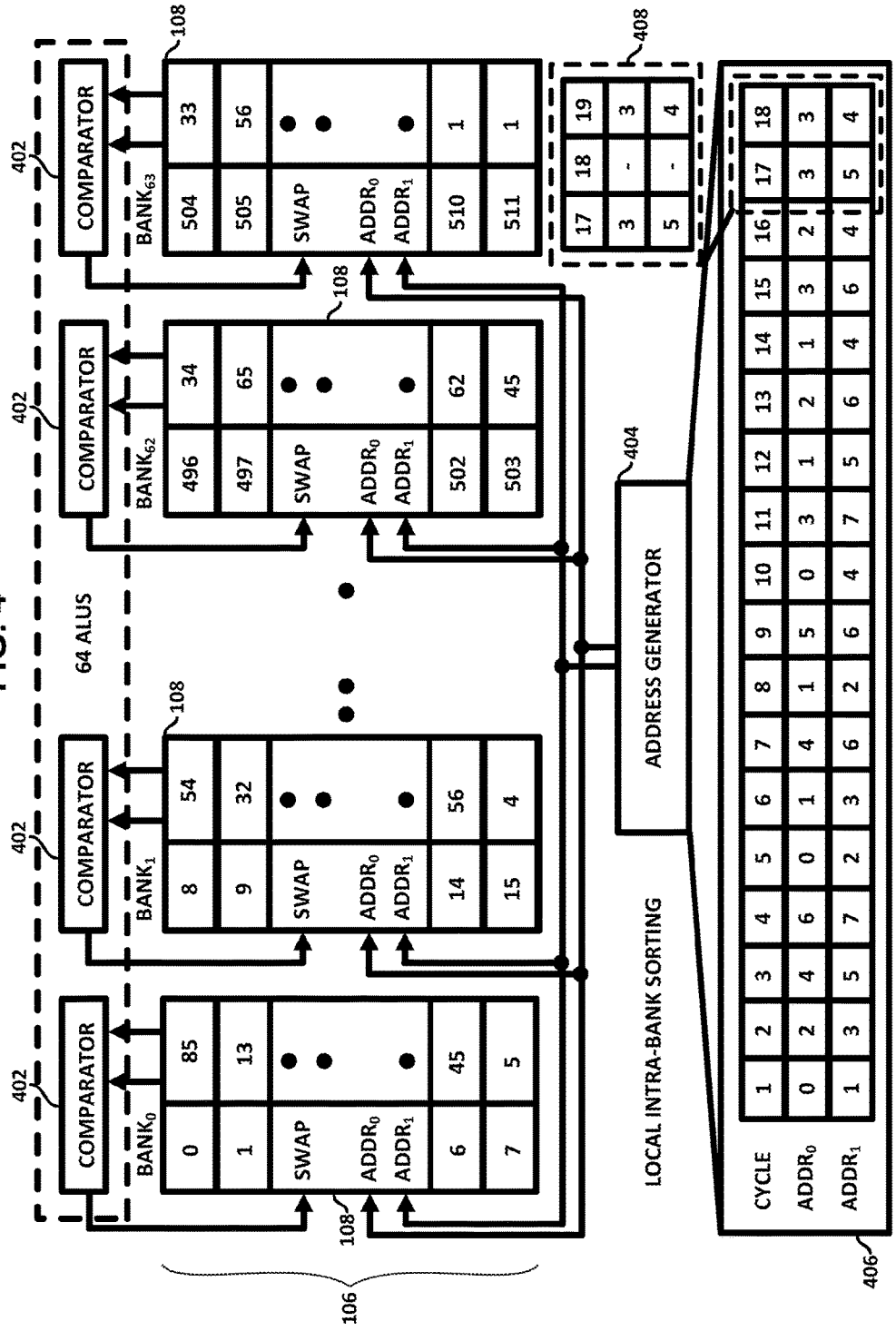
FIG. 4 illustrates a primary symbol memory and weight sorter in accordance with certain embodiments.

FIG. 4 illustrates a primary symbol memory 106 and weight sorter in accordance with certain embodiments. In a particular embodiment, the weight sorter depicted may be a portion of the weight sorter and tree generator 114. In the depicted embodiment, primary symbol memory 106 comprises 64 banks 108 of memory that each include storage for eight entries, where each entry stores a number of a primary symbol and an associated weight. As described earlier, in some embodiments, the weights may be overwritten with depths during update depth operation 208, thus an entry of a bank 108 may be able to store a depth in place of a weight. In an alternative embodiment, an entry may include additional storage for a depth (or the depths may be stored in a different memory). The primary symbol memory 106 is adapted for use in compression of a data set that allows a maximum of 512 unique primary symbols. In other embodiments, the primary symbol memory 106 may include any suitable number of banks and each bank may be any suitable size (e.g., each bank may store 4, 8, 16, 32, 64, other power of 2, or other number of primary symbol numbers and weights).

In various embodiments, the product of the number of banks and the number of entries of each bank is equal to the maximum number of primary symbols. In particular embodiments, each bank is the same size (i.e., stores the same number of entries). In particular embodiments, each bank may include its own port (or multiple ports) for reading data from or writing data to an entry of the bank. Thus, in various embodiments, write or read operations may be performed on any number of the banks during a given clock cycle. Thus, in a particular embodiment, each bank may simultaneously provide an output to weight sorter and tree generator 114 during a sort operation.

In various embodiments, the tree generation operation 206 progresses concurrently with the weight sorting operation 204, thus eliminating sorting overhead from overall Huffman encoding latency. This is accomplished using a two phase sorting scheme including an intra-bank sort and an inter-bank sort. This scheme exploits the property that a new intermediate Huffman tree symbol may be generated by identifying the two symbols with the lowest weights, and does not require sorting the entire array of primary symbols in order based on their weight. In the embodiment depicted, the 512 symbol weights are partitioned among banks 108. In a particular embodiment, the symbol numbers and associated weights are stored in ascending order. For example, symbol numbers 1-7 are stored in $bank_0$, symbol numbers 8-15 are stored in $bank_1$, and so on.

Each bank 108 is coupled to a respective comparator 402. The comparator 402 (and/or other suitable logic) coupled to a bank performs a local intra-bank sort for the bank 108 to which it is coupled. That is, the comparator 402 sorts the entries of the bank in order from highest weight to lowest weight. Thus, a group of 64 comparators 402 compare entries within the 64 banks respectively to perform a local intra-bank sort of each bank. Limiting the size of each bank to 8 entries allows this initial sort to be completed fairly quickly (e.g., in 18 cycles), though any suitable arrangements are contemplated by this disclosure. In a particular embodiment, a comparator 402 may include any suitable logic (e.g., an ALU and/or other logic) for comparing two weights to determine which weight is largest (or whether the weights are equal).

In addition to comparators 402, weight sorter and tree generator 114 includes address generator 404. Address generator 404 may be operable to generate two bank addresses each clock cycle. The bank addresses each specify an index of an entry of a bank that includes a weight to be compared during the cycle. The addresses output by the address generator may be provided to each bank 108 simultaneously such that the weights of the same two entries of each bank are compared each cycle. For example, during a first cycle, the weight at entry 0 (85) of $bank_0$ is compared to the weight at entry 1 (13) of $bank_0$ and the values in the entries (i.e., the weights and the symbol numbers) are swapped if the weight at the higher index is higher than the weight at the lower index. Simultaneously, during the first cycle, the weight at entry 0 (54) of $bank_1$ is compared to the weight at entry 1 (32) of $bank_1$ and the values of the entries are swapped if the weight at the higher index is higher than the weight at the lower index. Similar comparisons and swaps may be performed during the first cycle for the remaining banks 108. During the second cycle, the weights at each entry 2 of the banks is compared against the respective weights at each entry 3 of the banks and selectively swapped based on the comparison results.

In a particular embodiment, the address pairs generated by the address generator 404 during the intra-bank sort operation may be generated in such a way that no entry of a bank 108 is accessed consecutively for two cycles, except for a single cycle (e.g., the last cycle). In another embodiment, to avoid a read-after-write conflict in a cycle (e.g., the last cycle) in which the same entry is accessed as in the previous cycle, an idle event may be inserted in a cycle in between two cycles in which the address generator 404 generates the same address. For example, in the sequence depicted by 408, instead of $address_0$ being set to 3 during the $17^{th}$ and $18^{th}$ cycles, an idle cycle is in between these cycles such that any swaps involving data at entry 3 of any of the banks may be completed before entry 3 is accessed again at each bank for a comparison in the $19^{th}$ cycle. In other embodiments, the idle cycle may be inserted at any suitable position in between two cycles output by address generator 404 that include the same address. This technique allows operand comparisons and swap operations to be performed in different cycles in a pipelined fashion, reducing the system critical path and allowing an increase in clock speed (e.g., of a clock coupled to banks 108 and/or comparators 402) relative to an embodiment in which an entry is accessed in consecutive cycles. For example, comparisons between the weights at entries 0 of the banks and the weights at entries 1 may be performed during a first cycle. During a second cycle, any necessary swaps between the values stored by the entries 0 and the entries 1 may be performed. In addition, during the second cycle, comparisons between the weights at entries 2 of the banks and the weights at entries 3 may be performed. During a third cycle, any necessary swaps between the values stored by the entries 2 and the entries 3 are performed. In addition, during the third cycle, comparisons between the weights at entries 4 of the banks and the weights at entries 5 may be performed, and so on.

Figure 5:
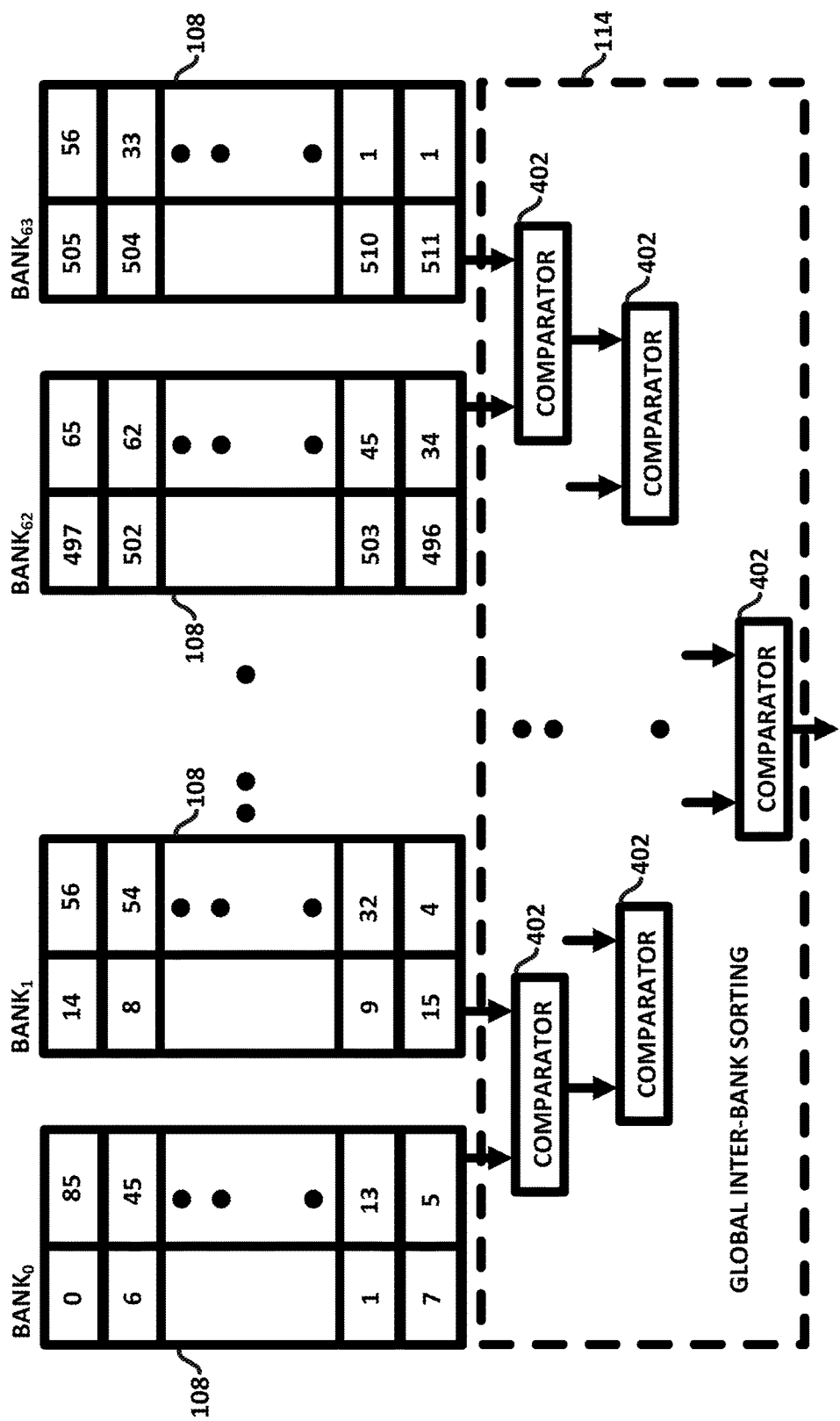
FIG. 5 illustrates banks of a primary symbol memory and a portion of weight sorter and tree generator in accordance with certain embodiments.

FIG. 5 illustrates banks 108 of a primary symbol memory 106 and a portion of weight sorter and tree generator 114 in accordance with certain embodiments. In contrast to prior approaches in which a complete sort of all symbol weights is performed before starting intermediate symbol generation, various embodiments may initiate intermediate symbol generation of the Huffman tree after completion of the partial sort performed via the intra-bank sort operation, and the intermediate symbol generation may be performed concurrently with an inter-bank sort operation.

The inter-bank sort operation may include comparison of the lowest weighted primary symbols of all the banks 108 to identify the primary symbol with the overall smallest weight. In a particular embodiment, the inter-bank sorting operation may reuse a plurality of the comparators 402 used during the intra-bank sort operation. For example, in the embodiment depicted, all of the comparators except one are reused. In the embodiment depicted, the 63 comparators 108 may be cascaded so that the comparison operation may be pipelined. The highest level of comparators includes 32 comparators, the next level includes 16 comparators, the next level includes 8 comparators, the next level includes 4 comparators, the next level includes 2 comparators, and the lowest level includes a single comparator. Each comparator at the highest level may compare the lowest weighted symbols of two different banks (in various embodiments, symbols having a weight of 0 may be skipped over as they do not participate in generation of the intermediate symbols of the Huffman tree). For example, a comparator 402 may compare the weight of symbol 7 of $bank_0$ against the weight of symbol 15 of $bank_1$. The outputs of the highest level comparators are provided to the next level of comparators. For example, the outputs of two comparators of the highest level comparators may be provided to a comparator of the next level. In various embodiments, this may include passing the lower weight and the corresponding symbol number to a comparator of the next level. This cascading continues down to the comparator at the lowest level, which determines the overall lowest weighted symbol.

In various embodiments, each bank 108 may be associated with a pointer that identifies the lowest weighted symbol of the bank that has not yet been consumed by the weight sorter and tree generator 114. Thus, when the inter-bank sorting operation begins, each bank pointer may point to the last entry (i.e., to the symbol with the lowest weight) of the bank. After a symbol weight has been consumed by weight sorter and tree generator 114, the pointer of that bank may be adjusted to point to the next entry with the next highest weight of the corresponding bank. For example, in the embodiment depicted, after the weight of symbol 511 has been compared against the weight of symbol 496 and determined to have the lower weight, the comparator may pass symbol 511 to the next level and the pointer of $bank_{63}$ may be adjusted to point to the entry storing data for symbol 510. In various embodiments, the pointers of each bank may be initialized to point to entries with weights larger than 0 (to skip the non-existent primary symbols).

When the last level comparator consumes a symbol (e.g., outputs that symbol as the lowest weighted symbol that has not yet been added to the Huffman), the last level comparator may send a signal to the comparator in the next highest level that output that signal. That comparator may then be free to consume an additional symbol from a comparator in the next highest level. These signals may trickle up to a comparator in the highest level of comparators which may then consume a new symbol from the relevant bank (and the bank pointer may be adjusted).

In the embodiment depicted, the weight sorter may take 8 cycles to produce the first output of the lowest level comparator (i.e., the lowest weighted symbol), but due to the pipelining of the comparators, the weight sorter may be able to produce an additional output (i.e., the second lowest weighted symbol) the next cycle (and may produce an additional output each additional cycle except in cases of stalling to be described below). These two symbols are then used as the basis for forming an intermediate symbol in a manner similar to that described above in connection with FIG. 2. The intermediate symbol (along with its weight and children symbols) may be stored in intermediate symbol memory 110. Thus, in the embodiment depicted, the two lowest weighted symbols 510 and 511 may be marked as children symbols of intermediate symbol 512, and intermediate symbol 512 is assigned a weight that is the sum of the weights of symbols 510 and 511 (2). The two lowest weighted symbols 510 and 511 may then be considered to have become part of the Huffman tree (as they have been assigned a parent symbol).

Because the intermediate symbols generated during creation of the Huffman tree are stored in their own dedicated array (i.e., intermediate symbol memory 110), they do not require additional sorting because they are generated with increasing weights (and thus may be located without performing an additional search). Hence, unlike traditional heap generation schemes where intermediate symbols undergo re-sorting with primary symbols (resulting in multiple cycles of comparison), various embodiments generate a new intermediate symbol by comparing four symbols that have not yet become part of the Huffman tree (e.g., have not been assigned a parent symbol yet): the two lowest weighted symbols obtained from the inter-bank sort (in particular embodiments one of these primary symbols may be stored in memory while the second primary symbol is generated) and the two lowest weighted intermediate symbols (which will be the earliest generated intermediate symbols) to determine which two symbols have the two lowest weights. In a particular embodiment, this operation may utilize three additional comparators (in a particular embodiment, one or more of these three comparators may also be used in the intra-bank sort operation). The two lowest weighted symbols may both be primary symbols, may both be intermediate symbols, or may be one of each. The two identified symbols are then used as a basis to form an additional intermediate symbol which is assigned as the parent symbol to the two identified symbols and has a weight equal to the combined weight of the two identified symbols. This inter-bank sorting process continues until a single intermediate symbol remains to be processed. That intermediate symbol is then assigned as the root node of the Huffman tree.

In various embodiments, during the comparison of the four symbols, if both of the symbols selected to be placed in the Huffman tree are intermediate symbols, the comparator pipeline may be stalled to pause the generation of an additional lowest weighted primary symbol until one of the primary symbols already generated is placed in the Huffman tree.

Various embodiments utilizing the techniques described above dramatically improve throughout by reducing the conventional super-linear relationship (i.e., $n*\text{Log}_2 n$) of weight sorting and tree generation latency to a linear (e.g., $1.5*n$) dependency (where n equals the number of primary symbols of the data set). For emerging standards like Brotli that use multiple Huffman trees that may each include roughly 500 symbols, various embodiments may result in a 5× speed-up for the weight sorting and tree generation operations.

Figure 6:
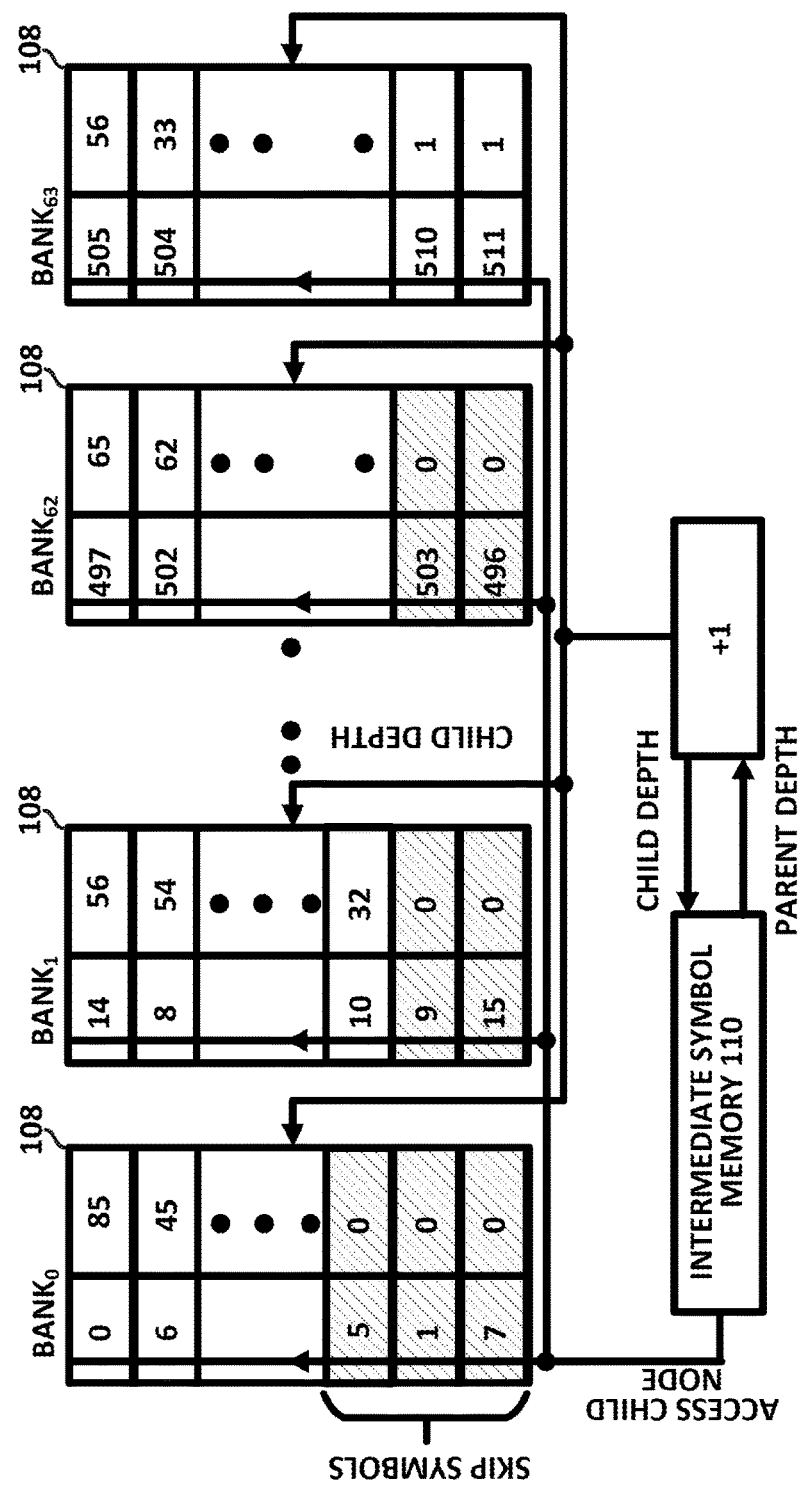
FIG. 6 illustrates a primary symbol memory and a flow for updating depths of symbols in accordance with certain embodiments.

FIG. 6 illustrates a primary symbol memory 106 and a flow for updating depths of symbols in accordance with certain embodiments. The concurrent sort and tree generation process culminates when all primary symbols and all but one of the intermediate symbols are consumed (i.e., placed in the Huffman tree as a child of an intermediate symbol). The intermediate symbols are then back traversed using the corresponding children symbol pointers (e.g., $CHD_0$ and $CHD_1$ values from intermediate symbol memory 110) from the root of the tree towards the leaf symbols (i.e., symbols without children) to compute the depth for each symbol, e.g., as described in connection with FIG. 3. The depth of each child symbol is calculated as the depth of the parent symbol plus one. This operation may include assigning depth to the intermediate symbols as well as to the primary symbols (i.e., leaf symbols).

In a particular embodiment, when a depth for a child symbol that is a primary symbol is calculated, the weight of that symbol in the symbol memory 106 (e.g., in the respective bank 108) is overwritten with the calculated depth. In a particular embodiment, compression engine 104 maintains a table having an entry for each potential code length (e.g., a 15 entry table for compression schemes utilizing code-lengths from 1 bit to 15 bits) that tracks the code count for each code length by incrementing the code-count for the corresponding depth of every leaf symbol (i.e., primary symbol) that is reached (e.g., each time the depth of a primary symbol is determined to be 12, the 12 bit code count is incremented).

After depths are assigned to each primary symbol, Huffman codes for all the symbols are generated by computing the starting codes (based on the code count of each code length) and selectively incrementing the codes as they are assigned to the primary symbols. In various embodiments, prior to computation of the Huffman codes, another round of intra-bank sorting may be utilized within each bank to ensure that the entries that were assigned depths (in various embodiments, the non-existent symbols may be ignored) are ordered according to their symbol number to simplify Huffman code generation. For example, the codes may be generated by determining a starting code for each code length, assigning that starting code to the lowest numbered symbol having that code length, and then incrementing the starting code by one for the symbol with the next highest symbol number that has that same code length.

Various embodiments may leverage the presence of partially sorted symbols within each bank 108 to opportunistically skip non-existent symbols as depicted in FIG. 6. The intra-bank sort operation results in non-existent symbols (i.e., symbols having weights of 0 due to not appearing in the data set) being placed at the bottom of their respective banks. During Huffman code generation, when a non-existent symbol is reached in a bank, the rest of the bank may be skipped by the code generator 118. Thus, at the next cycle, a symbol from the next bank may be processed (i.e., assigned a Huffman code). This further speeds up the final transcoding process wherein symbols are replaced with the Huffman codes to generate the final compressed payload.

In a particular embodiment, the depth update operation may be performed by writing the depth of a particular primary symbol into the entry corresponding to the symbol number in memory 106 (e.g., the entry at which the symbol number and the weight was initially stored prior to the intra-bank sort operation). In another embodiment, the depth may be written into the entry storing the symbol number after the intra-bank sort operation is performed. For example, referring to FIG. 6, the entry for symbol 0 did not switch places as a result of the intra-bank sort, thus the depth would be written to the same entry in either scheme. However, for symbol 6, the depth could be written to the sorted location (i.e., index 1 of $bank_0$) or to the initial location (i.e., index 6 of $bank_0$).

When the depths are written to the initial locations of the symbol numbers, the additional intra-bank sort operation referred to above may be omitted, as the depths of the symbols will be written in order of increasing symbol number. For example, the depth of symbol 0 will be written to index 0, the depth of symbol 1 will be written to index 1, the depth of symbol 8 will be written to index 0 of the second bank (which may correspond with an address of 8), the depth of symbol 511 will be written to index 7 of the $64^{th}$ bank (which may correspond with an address of 511). In various embodiments, the symbol numbers of each entry may or may not be restored to their initial values (in some embodiments it may not be necessary since a symbol number may be inferred from the memory location of the entry).

When the depths are written to the initial locations of the symbol numbers, one or more of the weights of 0 may be overwritten with a depth (and entries corresponding to the non-existent symbols may include weights from the sorted symbols instead of depths as these entries would not have been overwritten). In a particular embodiment, when a weight is overwritten with a depth, a valid bit of the corresponding entry may be set, such that entries storing depths may be distinguished from entries storing weights. Accordingly, when the Huffman codes are generated, the entries without valid bits may be skipped.

In a particular embodiment, an additional sorting operation may be performed to segregate the non-existent symbols to the bottom of the banks (e.g., using any suitable logic such as logic depicted in FIGS. 4 and 5) based on whether they have a valid bit set, such that when an entry that does not have a valid bit set is encountered during Huffman code generation, the remaining entries of the bank may be skipped. Such embodiments may include restoring the symbol numbers to each entry prior to the sorting such that the order of the symbol data within banks may be preserved (i.e., the first entry should correspond to the lowest numbered symbol, the second entry should correspond to the next lowest numbered symbol, etc.).

In a particular embodiment, in a scheme in which the depths are written to the sorted positions of the symbols, an intra-bank sort may be performed based on the symbol numbers to arrange the entries in order of increasing symbol number (to facilitate Huffman code generation as described above). In a particular embodiment, each symbol that has a weight of 0 (which is not overwritten by a depth when the depths are written to the sorted positions of the symbols), may be treated as if its index was higher than any index of a non-existent symbol in the bank, such that the non-existent symbols are sorted to the bottom of each bank (and may be skipped during code generation). In other embodiments, the additional intra-bank sort may be performed in any suitable manner to segregate the non-existent symbols of the banks.

Figure 7:
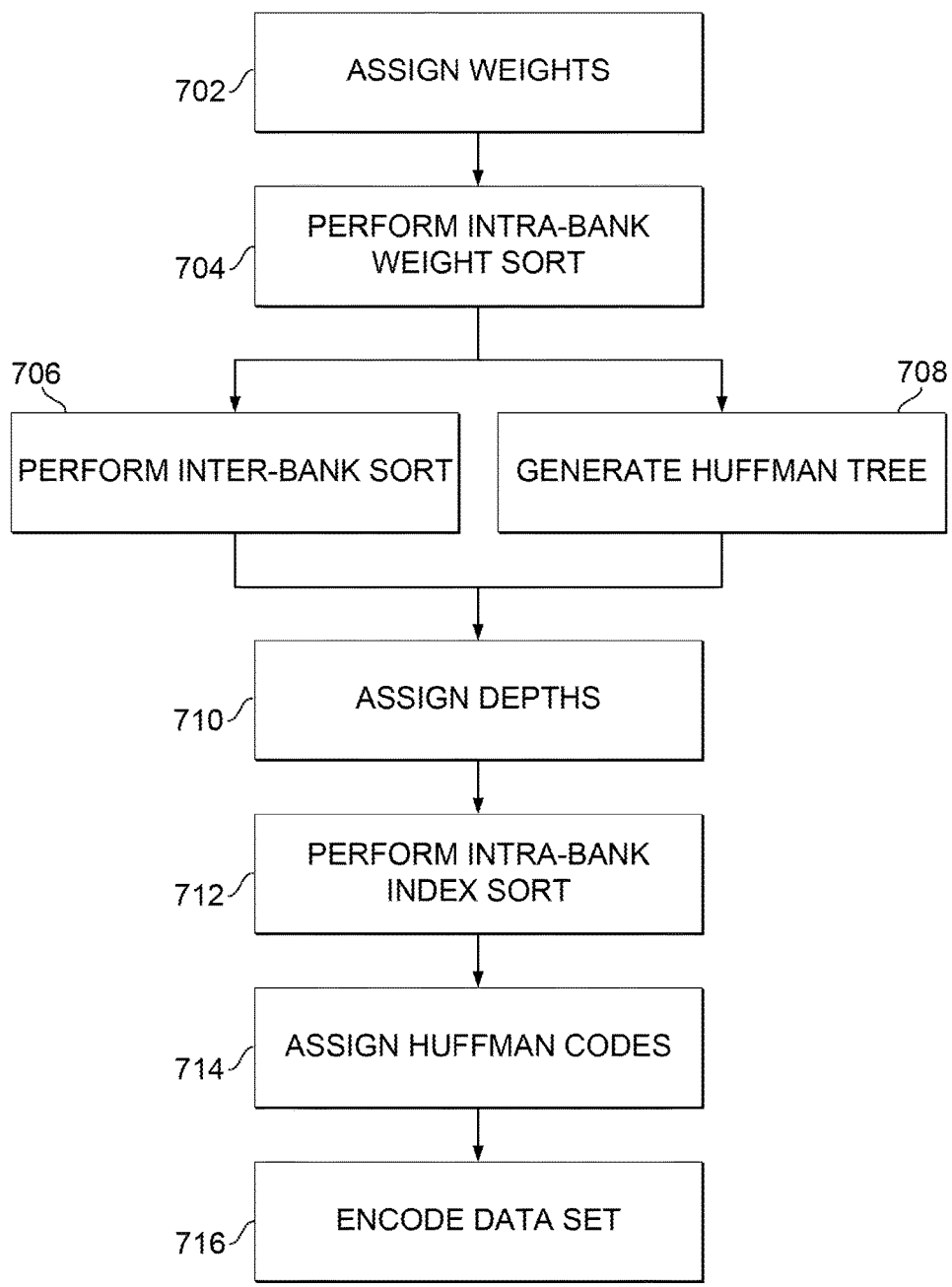
FIG. 7 illustrates an example flow for weight sorting and tree generation in accordance with certain embodiments.

FIG. 7 illustrates an example flow for weight sorting and tree generation in accordance with certain embodiments. In various embodiments, the flow may be performed by compression engine 104 and/or other suitable logic of a computer system.

At 702, weights are assigned to primary symbols based on the frequency of occurrence of the primary symbols in a data set to be compressed. In a particular embodiment, the symbol numbers and corresponding weights may be stored in a plurality of banks of primary symbol memory 106. At 704, an intra-bank weight sort is performed. The intra-bank weight sort may sort the symbols of each bank by their associated weight.

At 706 and 708 an inter-bank sort and generation of a Huffman tree may be performed concurrently. For example, a weight of a symbol from each bank may be compared against each other to determine the two lowest weighted symbols of the primary symbols and these symbols may be placed in a Huffman tree and used as a basis to form an intermediate symbol of the Huffman tree. The inter-bank sort may continue to generate the lowest weighted symbols that have not yet been placed in the Huffman tree and these symbols may be placed in the Huffman tree and used as a basis to form additional intermediate symbols.

Once the Huffman tree is generated, depths may be assigned to the intermediate symbols and the primary symbols at 710. At 712, an intra-bank index sort may be performed to reorder the depths stored in each bank in order of the symbol number that the depths correspond to. In alternative embodiments, an intra-bank index sort is not performed (for example, the depths may be written to indices corresponding to their respective symbol numbers at 710). At 714, Huffman codes are assigned to the primary symbols. At 716, the data set is encoded by replacing the primary symbols with the corresponding Huffman codes.

The flows described in the Figures above are merely representative of operations that may occur in particular embodiments. In other embodiments, additional operations may be performed. Various embodiments of the present disclosure contemplate any suitable signaling mechanisms for accomplishing the functions described herein. Some of the operations illustrated may be repeated, combined, modified, or omitted where appropriate. Additionally, operations may be performed in any suitable order without departing from the scope of particular embodiments.

As described above, symbol sorting and tree generation are generally regarded as the two most performance critical operations for generating Huffman codes that are subsequently used for data compression. As opposed to a conventional scheme where the entire array of weights is completely sorted and a heap is generated to create new intermediate symbols, various embodiments of the present disclosure opportunistically initiate intermediate symbol tree generation as soon as a pair of symbols with the least weights are identified. This technique allows the tree generation process to progress concurrently with sorting.

A two-dimensional sorting scheme may be used wherein the symbols are distributed among small units of memory (e.g., banks) which are locally sorted to trigger the start of tree generation. The local sort may be sped up by selectively comparing symbols that avoid read-after-write conflicts, allowing pipelined operations by eliminating idle cycles arising out of data dependency. This approach not only amortizes tree generation latency with concurrent sorting, but also enables optimal hardware usage by maximizing ALU or other comparison logic utilization during both stages of sorting.

Following the generation of intermediate symbols, the partially sorted symbol banks are re-used to generate Huffman codes. The initial pre-sort process may gather non-existent symbols (symbols with zero weights) together, putting them in consecutive entries. A valid pointer identifying the first non-zero symbol weight in each bank may enable opportunistically skipping the non-existent symbols in each bank. This accelerates the Huffman code generation completion step, resulting in an earlier start for the symbol transcoding phase, wherein symbols are replaced by their respective Huffman codes to create the compressed bitstream.

Conventional approaches for Huffman code generation may incur ~50,000 cycles of latency for DEFLATE payloads that use two Huffman trees (a 286 code tree and a 30 code tree). Emerging standards like the Brotli compression scheme use multiple such trees, resulting in a latency that can exceed 200K cycles making these approaches undesirable for compressing small packets. Various embodiments of the present disclosure may enable a speed-up of an order of magnitude or more, e.g., reducing code generation latency down to ~2000 cycles in some hardware implementations. The sorting assisted code skipping scheme also enables speed-up of compression for payloads that do not use all allowed symbols for compressing a payload. For example, compression standards like Brotli and DEFLATE allow a large history (up to 64 KB) and a long copy length (up to 286 Bytes) for compressing a payload. However, many scenarios such as firmware compression, FPGA configuration, IoT sensor data compression etc. generate bitstreams that span a few KBs, and hence use only a limited number of symbols. Opportunistically skipping a majority of the non-existent symbols allows earlier generation of Huffman codes for symbols resulting in faster compression.

The Huffman encoding schemes proposed herein not only dramatically improve compression throughput for small payloads, but also enable area savings in highly parallel multi-threaded compression datapaths where a single code generation module may generate Huffman trees for different blocks in a time multiplexed manner.

The figures below detail exemplary architectures and systems to implement embodiments of the above. For example, any of the processors and/or systems described below may include compression engine 104. As another example, the functions of compression engine 104 may be implemented by one or more cores of a processor. In some embodiments, one or more hardware components and/or instructions described above are emulated as detailed below, or implemented as software modules.

Figure 8:
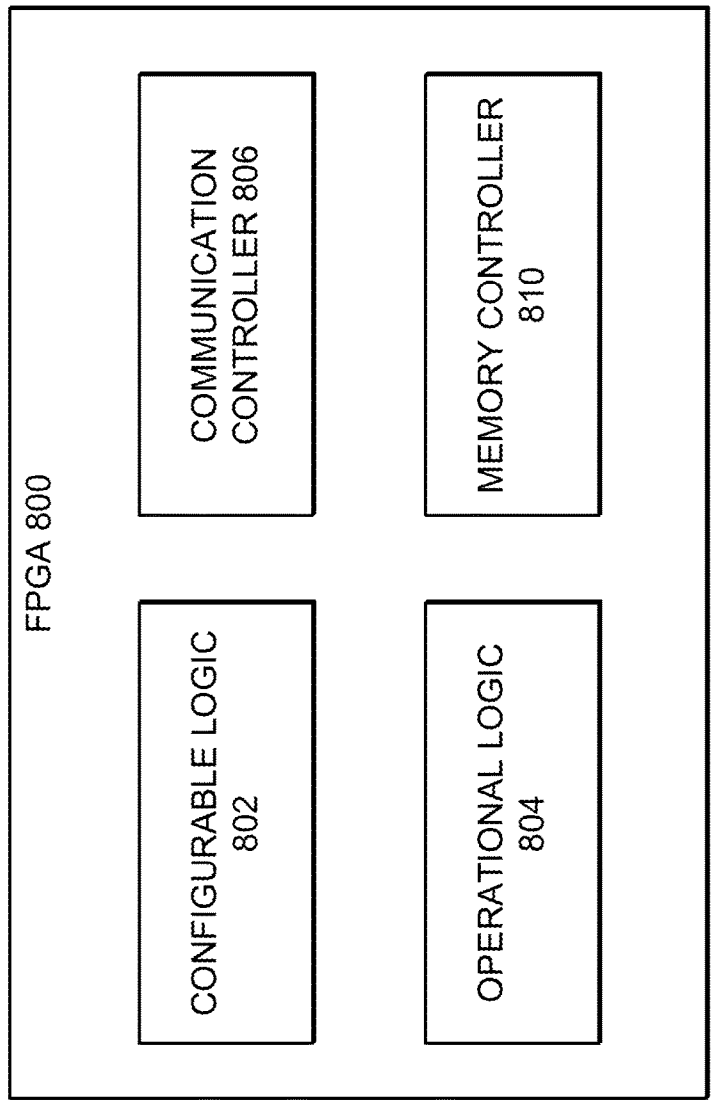
FIG. 8 illustrates an example block diagram of an FGPA in accordance with certain embodiments.

FIG. 8 illustrates an example block diagram of an FGPA 800 in accordance with certain embodiments. In a particular embodiment, a compression engine 104 may be implemented by an FPGA 800. An FPGA may be a semiconductor device that includes configurable logic. An FPGA may be programmed via a data structure (e.g., a bitstream) having any suitable format that defines how the logic of the FPGA is to be configured. An FPGA may be reprogrammed any number of times after the FPGA is manufactured.

In the depicted embodiment, FPGA 800 includes configurable logic 802, operational logic 804, communication controller 806, and memory controller 810. Configurable logic 802 may be programmed to implement one or more kernels. A kernel may comprise configured logic of the FPGA that may receive a set of one or more inputs, process the set of inputs using the configured logic, and provide a set of one or more outputs. The kernel may perform any suitable type of processing. In various embodiments, a kernel may comprise a prefix decoder engine. Some FPGAs 800 may be limited to executing a single kernel at a time while other FPGAs may be capable of executing multiple kernels simultaneously. The configurable logic 802 may include any suitable logic, such as any suitable type of logic gates (e.g., AND gates, XOR gates) or combinations of logic gates (e.g., flip flops, look up tables, adders, multipliers, multiplexers, demultiplexers). In some embodiments, the logic is configured (at least in part) through programmable interconnects between logic components of the FPGA.

Operational logic 804 may access a data structure defining a kernel and configure the configurable logic 802 based on the data structure and perform other operations of the FPGA. In some embodiments, operational logic 804 may write control bits to memory (e.g., nonvolatile flash memory or SRAM based memory) of the FPGA 800 based on the data structure, wherein the control bits operate to configure the logic (e.g., by activating or deactivating particular interconnects between portions of the configurable logic). The operational logic 804 may include any suitable logic (which may be implemented in configurable logic or fixed logic), such as one or more memory devices including any suitable type of memory (e.g., random access memory (RAM)), one or more transceivers, clocking circuitry, one or more processors located on the FPGA, one or more controllers, or other suitable logic.

Communication controller 806 may enable FPGA 800 to communicate with other components (e.g., a compression engine) of a computer system (e.g., to receive commands to compress data sets). Memory controller 810 may enable the FPGA to read data (e.g., operands or results) from or write data to memory of a computer system. In various embodiments, memory controller 810 may comprise a direct memory access (DMA) controller.

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

FIG. 9A is a block diagram illustrating both an exemplary in-order pipeline and an exemplary register renaming, out-of-order issue/execution pipeline according to embodiments of the disclosure. FIG. 9B is a block diagram illustrating both an exemplary embodiment of an in-order architecture core and an exemplary register renaming, out-of-order issue/execution architecture core to be included in a processor according to embodiments of the disclosure. The solid lined boxes in FIGS. 9A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 9A, a processor pipeline 900 includes a fetch stage 902, a length decode stage 904, a decode stage 906, an allocation stage 908, a renaming stage 910, a scheduling (also known as a dispatch or issue) stage 912, a register read/memory read stage 914, an execute stage 916, a write back/memory write stage 918, an exception handling stage 922, and a commit stage 924.

FIG. 9B shows processor core 990 including a front end unit 930 coupled to an execution engine unit 950, and both are coupled to a memory unit 970. The core 990 may be a reduced instruction set computing (RISC) core, a complex instruction set computing (CISC) core, a very long instruction word (VLIW) core, or a hybrid or alternative core type. As yet another option, the core 990 may be a special-purpose core, such as, for example, a network or communication core, compression and/or decompression engine, coprocessor core, general purpose computing graphics processing unit (GPGPU) core, graphics core, or the like.

The front end unit 930 includes a branch prediction unit 932 coupled to an instruction cache unit 934, which is coupled to an instruction translation lookaside buffer (TLB) 936, which is coupled to an instruction fetch unit 938, which is coupled to a decode unit 940. The decode unit 940 (or decoder) may decode instructions, and generate as an output one or more micro-operations, micro-code entry points, microinstructions, other instructions, or other control signals, which are decoded from, or which otherwise reflect, or are derived from, the original instructions. The decode unit 940 may be implemented using various different mechanisms. Examples of suitable mechanisms include, but are not limited to, look-up tables, hardware implementations, programmable logic arrays (PLAs), microcode read only memories (ROMs), etc. In one embodiment, the core 990 includes a microcode ROM or other medium that stores microcode for certain macroinstructions (e.g., in decode unit 940 or otherwise within the front end unit 930). The decode unit 940 is coupled to a rename/allocator unit 952 in the execution engine unit 950.

The execution engine unit 950 includes the rename/allocator unit 952 coupled to a retirement unit 954 and a set of one or more scheduler unit(s) 956. The scheduler unit(s) 956 represents any number of different schedulers, including reservations stations, central instruction window, etc. The scheduler unit(s) 956 is coupled to the physical register file(s) unit(s) 958. Each of the physical register file(s) units 958 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 958 comprises a vector registers unit, a write mask registers unit, and a scalar registers unit. These register units may provide architectural vector registers, vector mask registers, and general purpose registers. The physical register file(s) unit(s) 958 is overlapped by the retirement unit 954 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 954 and the physical register file(s) unit(s) 958 are coupled to the execution cluster(s) 960. The execution cluster(s) 960 includes a set of one or more execution units 962 and a set of one or more memory access units 964. The execution units 962 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 956, physical register file(s) unit(s) 958, and execution cluster(s) 960 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 964). It should also be understood that where separate pipelines are used, one or more of these pipelines may be out-of-order issue/execution and the rest in-order.

The set of memory access units 964 is coupled to the memory unit 970, which includes a data TLB unit 972 coupled to a data cache unit 974 coupled to a level 2 (L2) cache unit 976. In one exemplary embodiment, the memory access units 964 may include a load unit, a store address unit, and a store data unit, each of which is coupled to the data TLB unit 972 in the memory unit 970. The instruction cache unit 934 is further coupled to a level 2 (L2) cache unit 976 in the memory unit 970. The L2 cache unit 976 is coupled to one or more other levels of cache and eventually to a main memory.

By way of example, the exemplary register renaming, out-of-order issue/execution core architecture may implement the pipeline 900 as follows: 1) the instruction fetch 938 performs the fetch and length decoding stages 902 and 904; 2) the decode unit 940 performs the decode stage 906; 3) the rename/allocator unit 952 performs the allocation stage 908 and renaming stage 910; 4) the scheduler unit(s) 956 performs the schedule stage 912; 5) the physical register file(s) unit(s) 958 and the memory unit 970 perform the register read/memory read stage 914; the execution cluster 960 perform the execute stage 916; 6) the memory unit 970 and the physical register file(s) unit(s) 958 perform the write back/memory write stage 918; 7) various units may be involved in the exception handling stage 922; and 8) the retirement unit 954 and the physical register file(s) unit(s) 958 perform the commit stage 924.

The core 990 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 990 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 934/974 and a shared L2 cache unit 976, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 10B:
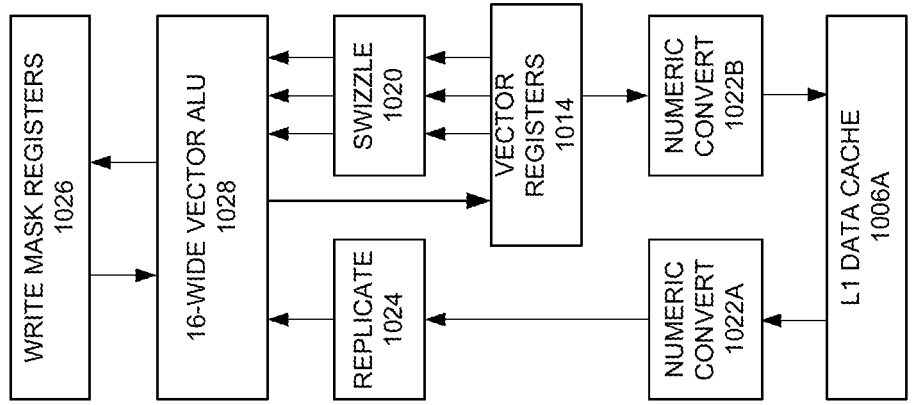
FIGS. 10A-B illustrate a block diagram of a more specific exemplary in-order core architecture, which core would be one of several logic blocks (potentially including other cores of the same type and/or different types) in a chip in accordance with certain embodiments.
Figure 10A:
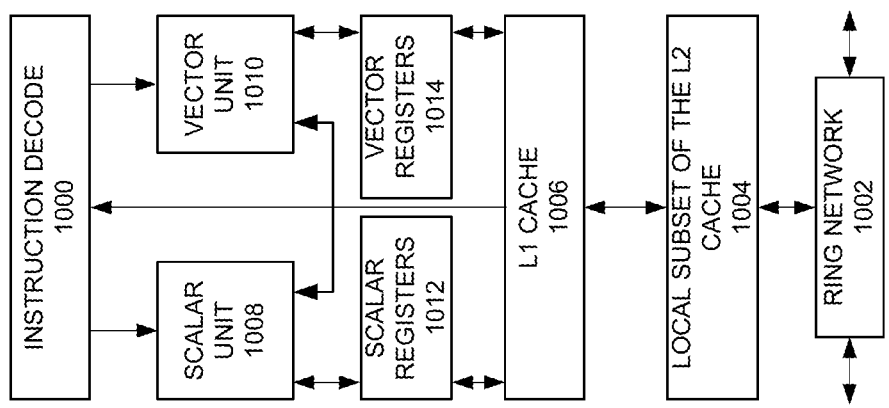

FIGS. 10A-B illustrate a block diagram of a more specific exemplary in-order core architecture, which core would be one of several logic blocks (potentially including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 10A is a block diagram of a single processor core, along with its connection to the on-die interconnect network 1002 and with its local subset of the Level 2 (L2) cache 1004, according to various embodiments. In one embodiment, an instruction decoder 1000 supports the x86 instruction set with a packed data instruction set extension. An L1 cache 1006 allows low-latency accesses to cache memory into the scalar and vector units. While in one embodiment (to simplify the design), a scalar unit 1008 and a vector unit 1010 use separate register sets (respectively, scalar registers 1012 and vector registers 1014) and data transferred between them is written to memory and then read back in from a level 1 (L1) cache 1006, alternative embodiments may use a different approach (e.g., use a single register set or include a communication path that allow data to be transferred between the two register files without being written and read back).

The local subset of the L2 cache 1004 is part of a global L2 cache that is divided into separate local subsets (in some embodiments one per processor core). Each processor core has a direct access path to its own local subset of the L2 cache 1004. Data read by a processor core is stored in its L2 cache subset 1004 and can be accessed quickly, in parallel with other processor cores accessing their own local L2 cache subsets. Data written by a processor core is stored in its own L2 cache subset 1004 and is flushed from other subsets, if necessary. The ring network ensures coherency for shared data. The ring network is bi-directional to allow agents such as processor cores, L2 caches and other logic blocks to communicate with each other within the chip. In a particular embodiment, each ring data-path is 1012-bits wide per direction.

FIG. 10B is an expanded view of part of the processor core in FIG. 10A according to embodiments. FIG. 10B includes an L1 data cache 1006A (part of the L1 cache 1006), as well as more detail regarding the vector unit 1010 and the vector registers 1014. Specifically, the vector unit 1010 is a 16-wide vector processing unit (VPU) (see the 16-wide ALU 1028), which executes one or more of integer, single-precision float, and double-precision float instructions. The VPU supports swizzling the register inputs with swizzle unit 1020, numeric conversion with numeric convert units 1022A-B, and replication with replication unit 1024 on the memory input. Write mask registers 1026 allow predicating resulting vector writes.

Figure 11:
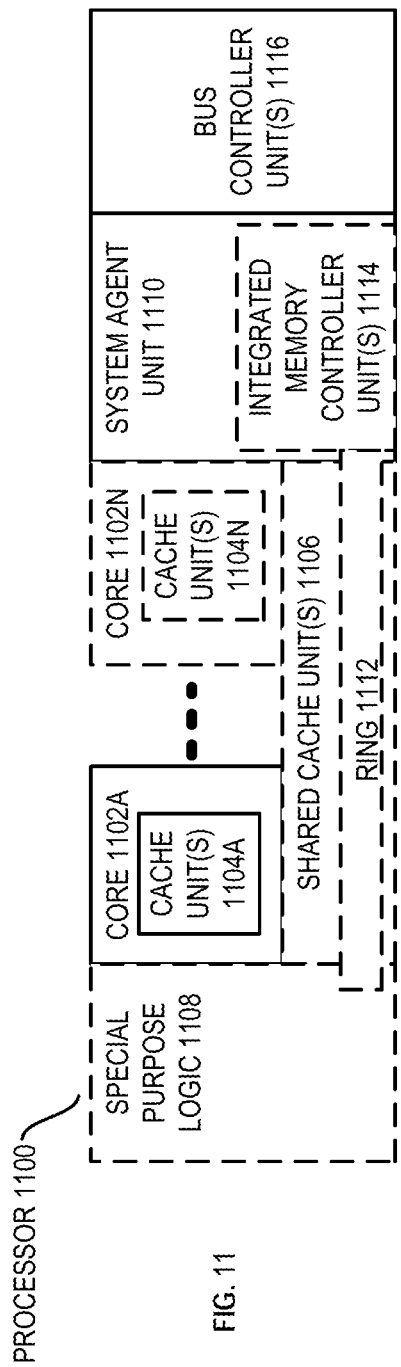
FIG. 11 is a block diagram of a processor that may have more than one core, may have an integrated memory controller, and may have integrated graphics in accordance with certain embodiments.

FIG. 11 is a block diagram of a processor 1100 that may have more than one core, may have an integrated memory controller, and may have integrated graphics according to various embodiments. The solid lined boxes in FIG. 11 illustrate a processor 1100 with a single core 1102A, a system agent 1110, and a set of one or more bus controller units 1116; while the optional addition of the dashed lined boxes illustrates an alternative processor 1100 with multiple cores 1102A-N, a set of one or more integrated memory controller unit(s) 1114 in the system agent unit 1110, and special purpose logic 1108.

Thus, different implementations of the processor 1100 may include: 1) a CPU with the special purpose logic 1108 being integrated graphics and/or scientific (throughput) logic (which may include one or more cores), and the cores 1102A-N being one or more general purpose cores (e.g., general purpose in-order cores, general purpose out-of-order cores, or a combination of the two); 2) a coprocessor with the cores 1102A-N being a large number of special purpose cores intended primarily for graphics and/or scientific (throughput); and 3) a coprocessor with the cores 1102A-N being a large number of general purpose in-order cores. Thus, the processor 1100 may be a general-purpose processor, coprocessor or special-purpose processor, such as, for example, a network or communication processor, compression and/or decompression engine, graphics processor, GPGPU (general purpose graphics processing unit), a high-throughput many integrated core (MIC) coprocessor (e.g., including 30 or more cores), embedded processor, or other fixed or configurable logic that performs logical operations. The processor may be implemented on one or more chips. The processor 1100 may be a part of and/or may be implemented on one or more substrates using any of a number of process technologies, such as, for example, BiCMOS, CMOS, or NMOS.

In various embodiments, a processor may include any number of processing elements that may be symmetric or asymmetric. In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

The memory hierarchy includes one or more levels of cache within the cores, a set or one or more shared cache units 1106, and external memory (not shown) coupled to the set of integrated memory controller units 1114. The set of shared cache units 1106 may include one or more mid-level caches, such as level 2 (L2), level 3 (L3), level 4 (L4), or other levels of cache, a last level cache (LLC), and/or combinations thereof. While in one embodiment a ring based interconnect unit 1112 interconnects the special purpose logic (e.g., integrated graphics logic) 1108, the set of shared cache units 1106, and the system agent unit 1110/integrated memory controller unit(s) 1114, alternative embodiments may use any number of well-known techniques for interconnecting such units. In one embodiment, coherency is maintained between one or more cache units 1106 and cores 1102A-N.

In some embodiments, one or more of the cores 1102A-N are capable of multithreading. The system agent 1110 includes those components coordinating and operating cores 1102A-N. The system agent unit 1110 may include for example a power control unit (PCU) and a display unit. The PCU may be or include logic and components needed for regulating the power state of the cores 1102A-N and the special purpose logic 1108. The display unit is for driving one or more externally connected displays.

The cores 1102A-N may be homogenous or heterogeneous in terms of architecture instruction set; that is, two or more of the cores 1102A-N may be capable of executing the same instruction set, while others may be capable of executing only a subset of that instruction set or a different instruction set.

FIGS. 12-15 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable for performing the methods described in this disclosure. In general, a huge variety of systems or electronic devices capable of incorporating a processor and/or other execution logic as disclosed herein are generally suitable.

Figure 12:
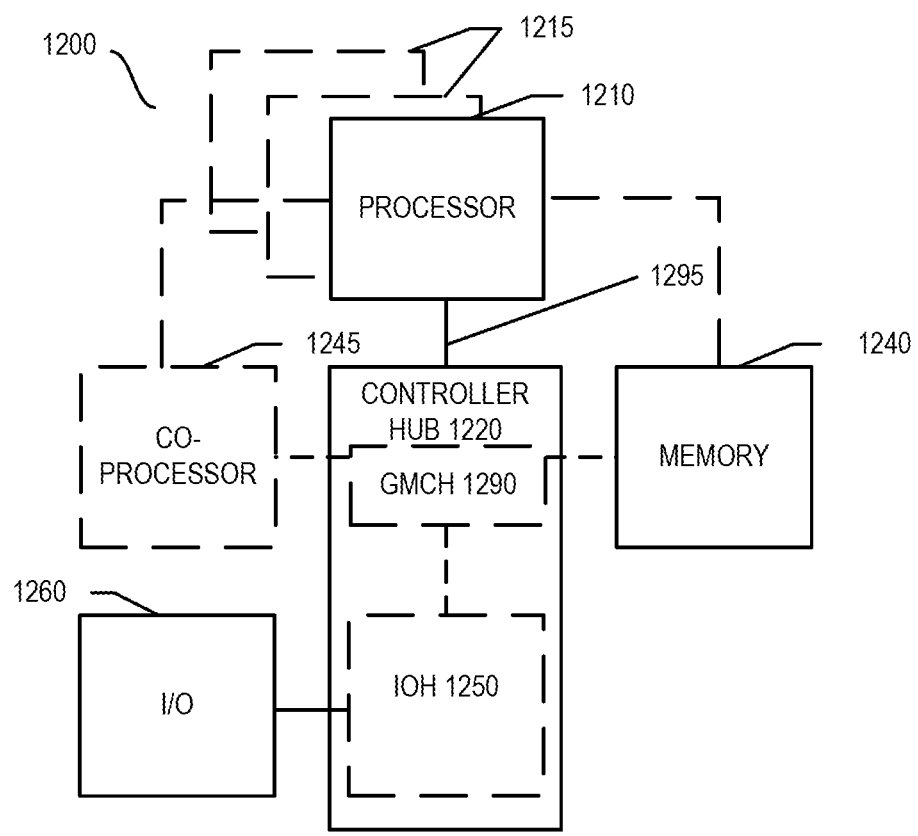
FIGS. 12, 13, 14, and 15 are block diagrams of exemplary computer architectures in accordance with certain embodiments.

FIG. 12 depicts a block diagram of a system 1200 in accordance with one embodiment of the present disclosure. The system 1200 may include one or more processors 1210, 1215, which are coupled to a controller hub 1220. In one embodiment, the controller hub 1220 includes a graphics memory controller hub (GMCH) 1290 and an Input/Output Hub (IOH) 1250 (which may be on separate chips or the same chip); the GMCH 1290 includes memory and graphics controllers coupled to memory 1240 and a coprocessor 1245; the IOH 1250 couples input/output (I/O) devices 1260 to the GMCH 1290. Alternatively, one or both of the memory and graphics controllers are integrated within the processor (as described herein), the memory 1240 and the coprocessor 1245 are coupled directly to the processor 1210, and the controller hub 1220 is a single chip comprising the IOH 1250.

The optional nature of additional processors 1215 is denoted in FIG. 12 with broken lines. Each processor 1210, 1215 may include one or more of the processing cores described herein and may be some version of the processor 1100.

The memory 1240 may be, for example, dynamic random access memory (DRAM), phase change memory (PCM), other suitable memory, or any combination thereof. The memory 1240 may store any suitable data, such as data used by processors 1210, 1215 to provide the functionality of computer system 1200. For example, data associated with programs that are executed or files accessed by processors 1210, 1215 may be stored in memory 1240. In various embodiments, memory 1240 may store data and/or sequences of instructions that are used or executed by processors 1210, 1215.

In at least one embodiment, the controller hub 1220 communicates with the processor(s) 1210, 1215 via a multidrop bus, such as a frontside bus (FSB), point-to-point interface such as QuickPath Interconnect (QPI), or similar connection 1295.

In one embodiment, the coprocessor 1245 is a special-purpose processor, such as, for example, a high-throughput MIC processor, a network or communication processor, compression and/or decompression engine, graphics processor, GPGPU, embedded processor, or the like. In one embodiment, controller hub 1220 may include an integrated graphics accelerator.

There can be a variety of differences between the physical resources 1210, 1215 in terms of a spectrum of metrics of merit including architectural, microarchitectural, thermal, power consumption characteristics, and the like.

In one embodiment, the processor 1210 executes instructions that control data processing operations of a general type. Embedded within the instructions may be coprocessor instructions. The processor 1210 recognizes these coprocessor instructions as being of a type that should be executed by the attached coprocessor 1245. Accordingly, the processor 1210 issues these coprocessor instructions (or control signals representing coprocessor instructions) on a coprocessor bus or other interconnect, to coprocessor 1245. Coprocessor(s) 1245 accept and execute the received coprocessor instructions.

Figure 13:
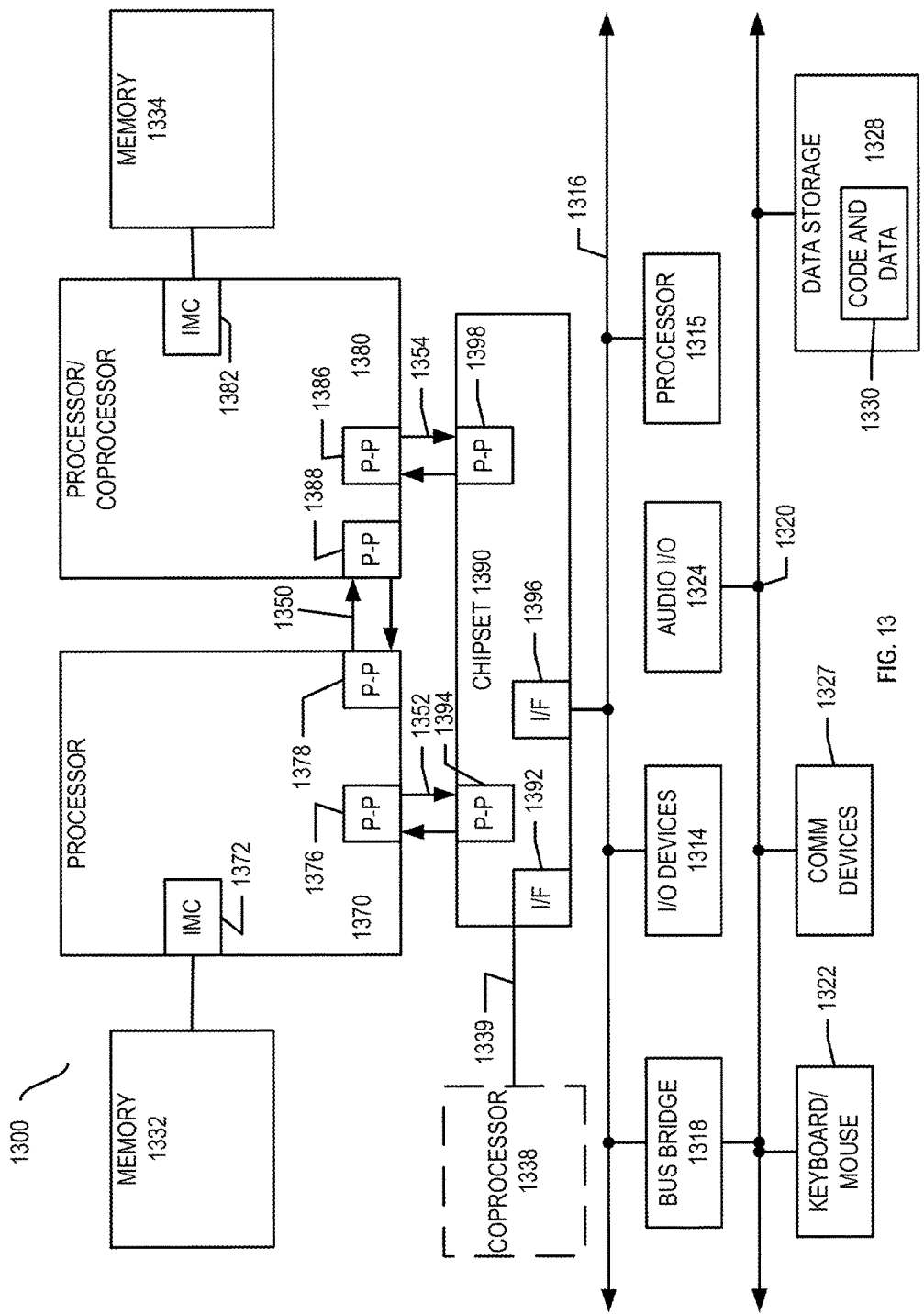

FIG. 13 depicts a block diagram of a first more specific exemplary system 1300 in accordance with an embodiment of the present disclosure. As shown in FIG. 13, multiprocessor system 1300 is a point-to-point interconnect system, and includes a first processor 1370 and a second processor 1380 coupled via a point-to-point interconnect 1350. Each of processors 1370 and 1380 may be some version of the processor 1100. In one embodiment of the disclosure, processors 1370 and 1380 are respectively processors 1210 and 1215, while coprocessor 1338 is coprocessor 1245. In another embodiment, processors 1370 and 1380 are respectively processor 1210 and coprocessor 1245.

Processors 1370 and 1380 are shown including integrated memory controller (IMC) units 1372 and 1382, respectively. Processor 1370 also includes as part of its bus controller unit's point-to-point (P-P) interfaces 1376 and 1378; similarly, second processor 1380 includes P-P interfaces 1386 and 1388. Processors 1370, 1380 may exchange information via a point-to-point (P-P) interface 1350 using P-P interface circuits 1378, 1388. As shown in FIG. 13, IMCs 1372 and 1382 couple the processors to respective memories, namely a memory 1332 and a memory 1334, which may be portions of main memory locally attached to the respective processors.

Processors 1370, 1380 may each exchange information with a chipset 1390 via individual P-P interfaces 1352, 1354 using point to point interface circuits 1376, 1394, 1386, 1398. Chipset 1390 may optionally exchange information with the coprocessor 1338 via a high-performance interface 1339. In one embodiment, the coprocessor 1338 is a special-purpose processor, such as, for example, a high-throughput MIC processor, a network or communication processor, compression and/or decompression engine, graphics processor, GPGPU, embedded processor, or the like.

A shared cache (not shown) may be included in either processor or outside of both processors, yet connected with the processors via a P-P interconnect, such that either or both processors' local cache information may be stored in the shared cache if a processor is placed into a low power mode.

Chipset 1390 may be coupled to a first bus 1316 via an interface 1396. In one embodiment, first bus 1316 may be a Peripheral Component Interconnect (PCI) bus, or a bus such as a PCI Express bus or another third generation I/O interconnect bus, although the scope of the present disclosure is not so limited.

As shown in FIG. 13, various I/O devices 1314 may be coupled to first bus 1316, along with a bus bridge 1318 which couples first bus 1316 to a second bus 1320. In one embodiment, one or more additional processor(s) 1315, such as coprocessors, high-throughput MIC processors, GPGPU's, accelerators (such as, e.g., graphics accelerators or digital signal processing (DSP) units), field programmable gate arrays, or any other processor, are coupled to first bus 1316. In one embodiment, second bus 1320 may be a low pin count (LPC) bus. Various devices may be coupled to a second bus 1320 including, for example, a keyboard and/or mouse 1322, communication devices 1327 and a storage unit 1328 such as a disk drive or other mass storage device which may include instructions/code and data 1330, in one embodiment. Further, an audio I/O 1324 may be coupled to the second bus 1320. Note that other architectures are contemplated by this disclosure. For example, instead of the point-to-point architecture of FIG. 13, a system may implement a multi-drop bus or other such architecture.

Figure 14:
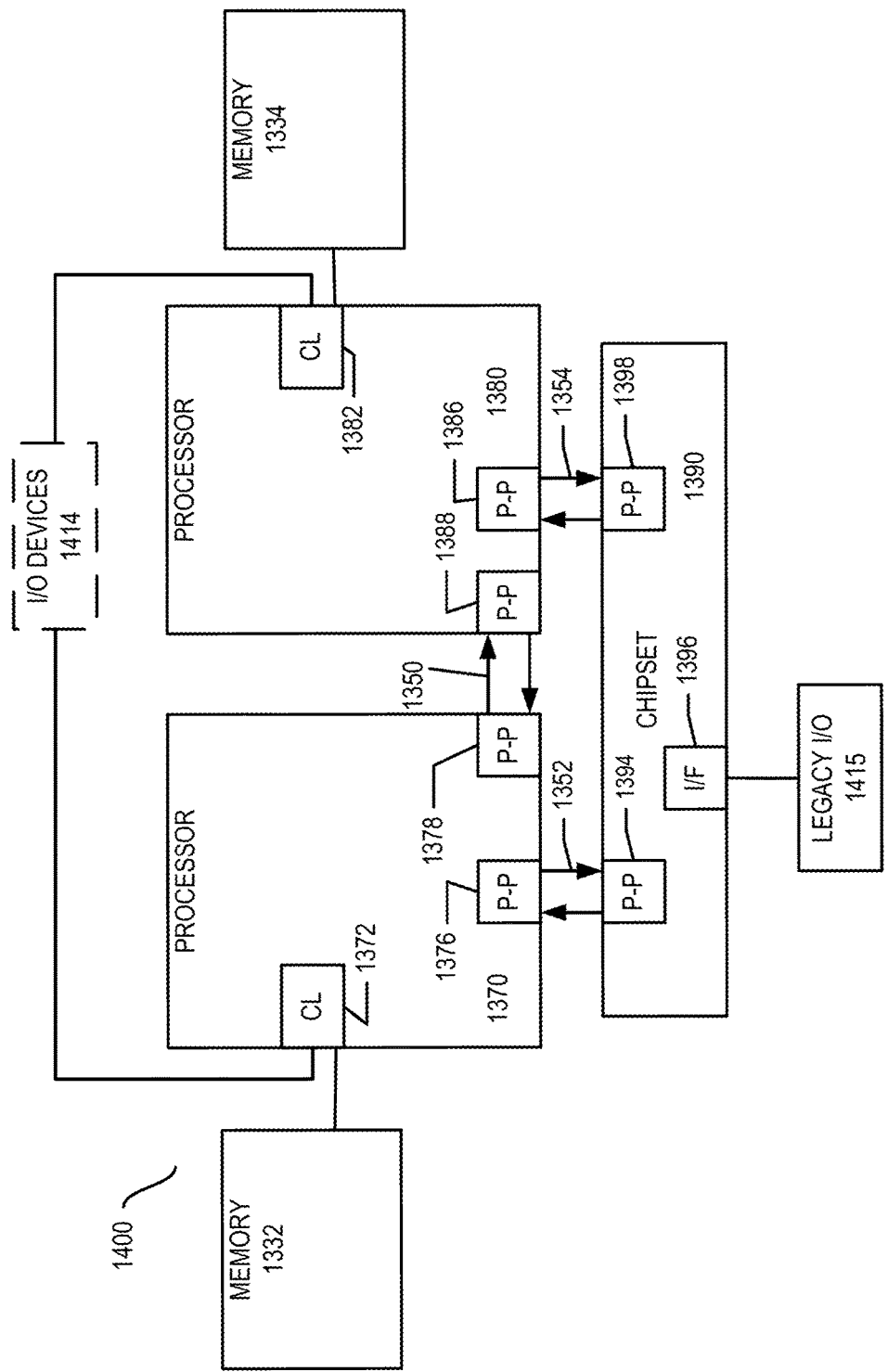

FIG. 14 depicts a block diagram of a second more specific exemplary system 1400 in accordance with an embodiment of the present disclosure. Similar elements in FIGS. 13 and 14 bear similar reference numerals, and certain aspects of FIG. 13 have been omitted from FIG. 14 in order to avoid obscuring other aspects of FIG. 14.

FIG. 14 illustrates that the processors 1370, 1380 may include integrated memory and I/O control logic ("CL") 1372 and 1382, respectively. Thus, the CL 1372, 1382 include integrated memory controller units and include I/O control logic. FIG. 14 illustrates that not only are the memories 1332, 1334 coupled to the CL 1372, 1382, but also that I/O devices 1414 are also coupled to the control logic 1372, 1382. Legacy I/O devices 1415 are coupled to the chipset 1390.

Figure 15:
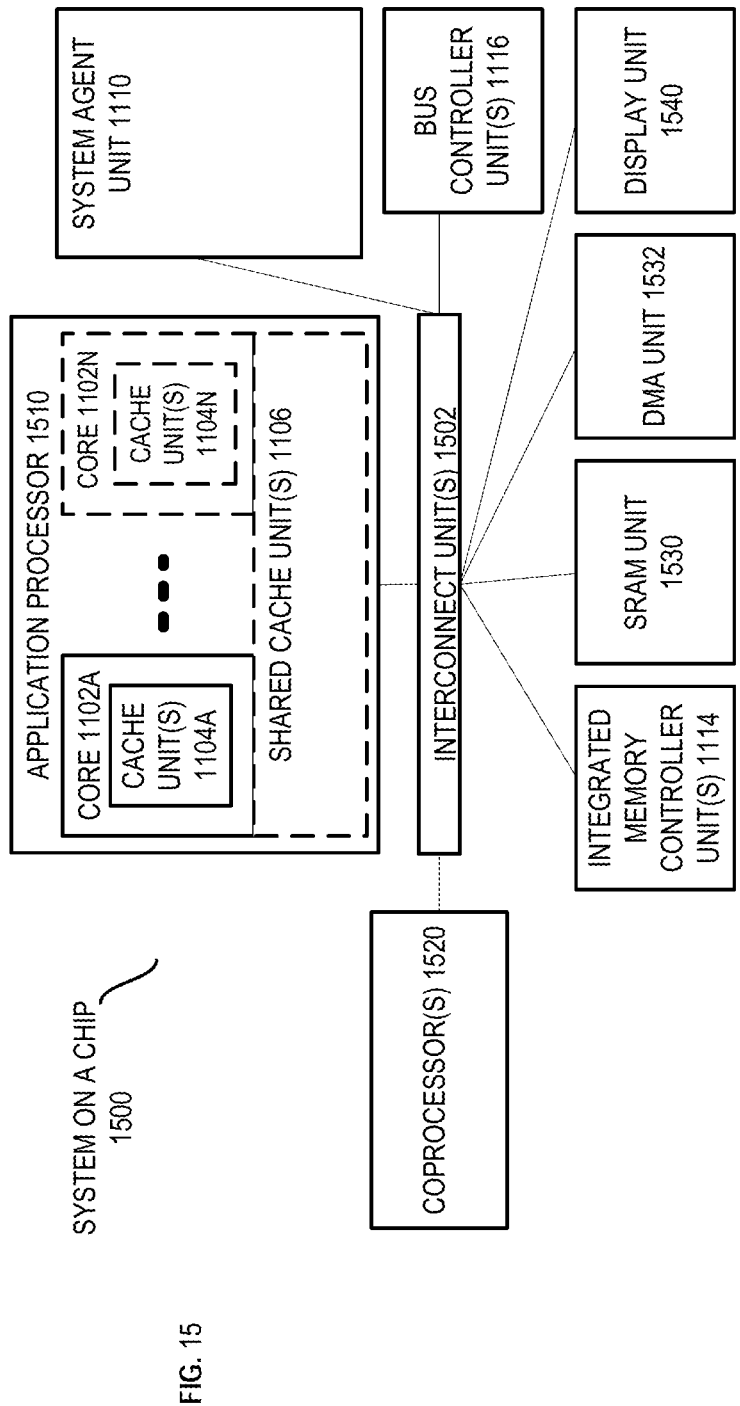

FIG. 15 depicts a block diagram of a SoC 1500 in accordance with an embodiment of the present disclosure. Similar elements in FIG. 11 bear similar reference numerals. Also, dashed lined boxes are optional features on more advanced SoCs. In FIG. 15, an interconnect unit(s) 1502 is coupled to: an application processor 1510 which includes a set of one or more cores 1102A-N and shared cache unit(s) 1106; a system agent unit 1110; a bus controller unit(s) 1116; an integrated memory controller unit(s) 1114; a set or one or more coprocessors 1520 which may include integrated graphics logic, an image processor, an audio processor, and a video processor; an static random access memory (SRAM) unit 1530; a direct memory access (DMA) unit 1532; and a display unit 1540 for coupling to one or more external displays. In one embodiment, the coprocessor(s) 1520 include a special-purpose processor, such as, for example, a network or communication processor, compression and/or decompression engine, GPGPU, a high-throughput MIC processor, embedded processor, or the like.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 16:
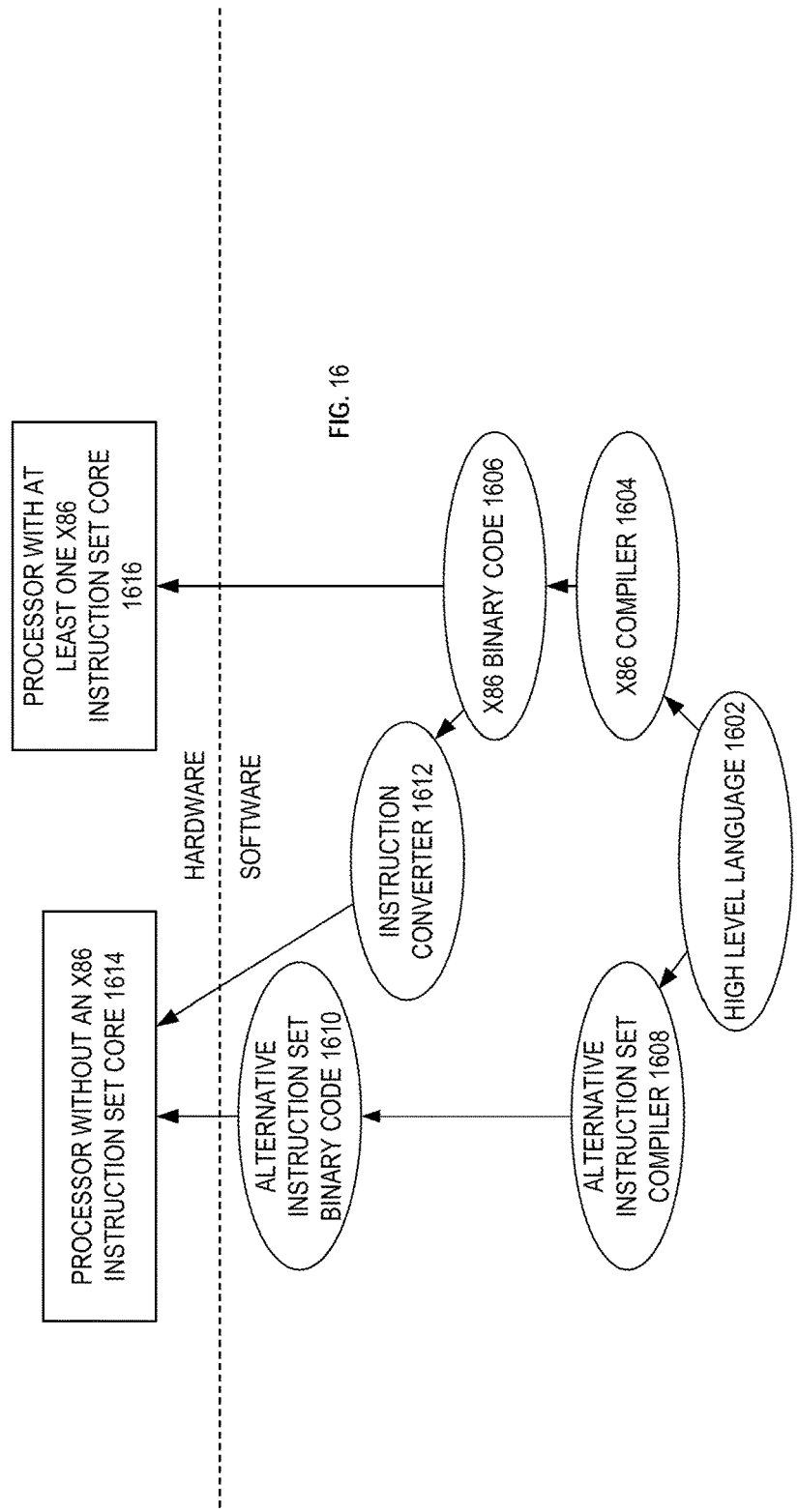
FIG. 16 is a block diagram contrasting the use of a software instruction converter to convert binary instructions in a source instruction set to binary instructions in a target instruction set in accordance with certain embodiments.

FIG. 16 is a block diagram contrasting the use of a software instruction converter to convert binary instructions in a source instruction set to binary instructions in a target instruction set according to embodiments of the disclosure. In the illustrated embodiment, the instruction converter is a software instruction converter, although alternatively the instruction converter may be implemented in software, firmware, hardware, or various combinations thereof. FIG. 16 shows a program in a high level language 1602 may be compiled using an x86 compiler 1604 to generate x86 binary code 1606 that may be natively executed by a processor with at least one x86 instruction set core 1616. The processor with at least one x86 instruction set core 1616 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1604 represents a compiler that is operable to generate x86 binary code 1606 (e.g., object code) that can, with or without additional linkage processing, be executed on the processor with at least one x86 instruction set core 1616. Similarly, FIG. 16 shows the program in the high level language 1602 may be compiled using an alternative instruction set compiler 1608 to generate alternative instruction set binary code 1610 that may be natively executed by a processor without at least one x86 instruction set core 1614 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1612 is used to convert the x86 binary code 1606 into code that may be natively executed by the processor without an x86 instruction set core 1614. This converted code is not likely to be the same as the alternative instruction set binary code 1610 because an instruction converter capable of this is difficult to make; however, the converted code will accomplish the general operation and be made up of instructions from the alternative instruction set. Thus, the instruction converter 1612 represents software, firmware, hardware, or a combination thereof that, through emulation, simulation or any other process, allows a processor or other electronic device that does not have an x86 instruction set processor or core to execute the x86 binary code 1606.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the manufacture of the described hardware.

In any representation of the design, the data representing the design may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

Thus, one or more aspects of at least one embodiment may be implemented by representative instructions stored on a machine-readable medium which represents various logic within the processor, which when read by a machine causes the machine to fabricate logic to perform the techniques described herein. Such representations, often referred to as "IP cores" may be stored on a non-transitory tangible machine readable medium and supplied to various customers or manufacturing facilities to load into the fabrication machines that manufacture the logic or processor.

Embodiments of the mechanisms disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code, such as code 1330 illustrated in FIG. 13, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In various embodiments, the language may be a compiled or interpreted language.

The embodiments of methods, hardware, software, firmware or code set forth above may be implemented via instructions or code stored on a machine-accessible, machine readable, computer accessible, or computer readable medium which are executable (or otherwise accessible) by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information therefrom.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Logic may be used to implement any of the flow operations or functionality of the various components such as processor 100, core 102, compression engine 104, primary symbol memory 106, intermediate symbol memory 110, weight updater 112, weight sorter and tree generator 114, depth updater 116, code generator 118, encoder 120, and FPGA 900, other component described herein, or any sub-component of any of these components. "Logic" may refer to hardware, firmware, software and/or combinations of each to perform one or more functions. As an example, logic may include hardware, such as a micro-controller or processor, associated with a non-transitory medium to store code adapted to be executed by the micro-controller or processor. Therefore, reference to logic, in one embodiment, refers to the hardware, which is specifically configured to recognize and/or execute the code to be held on a non-transitory medium. Furthermore, in another embodiment, use of logic refers to the non-transitory medium including the code, which is specifically adapted to be executed by the microcontroller to perform predetermined operations. And as can be inferred, in yet another embodiment, the term logic (in this example) may refer to the combination of the hardware and the non-transitory medium. In various embodiments, logic may include a microprocessor or other processing element operable to execute software instructions, discrete logic such as an application specific integrated circuit (ASIC), a programmed logic device such as a field programmable gate array (FPGA), a memory device containing instructions, combinations of logic devices (e.g., as would be found on a printed circuit board), or other suitable hardware and/or software. Logic may include one or more gates or other circuit components, which may be implemented by, e.g., transistors. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices. Often, logic boundaries that are illustrated as separate commonly vary and potentially overlap. For example, first and second logic may share hardware, software, firmware, or a combination thereof, while potentially retaining some independent hardware, software, or firmware.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

In at least one embodiment, an apparatus comprises a memory; and a compression engine comprising circuitry, the compression engine to assign weights to a plurality of first symbols of a data set, a weight representing a frequency of a corresponding first symbol in the data set; perform a partial sort of the first symbols based on the assigned weights; generate at least a portion of a Huffman tree based on the partial sort; and create a plurality of Huffman codes for the plurality of first symbols based on the Huffman tree.

In an embodiment, the compression engine is to store the assigned weights among a plurality of banks of the memory. In an embodiment, performing the partial sort comprises performing an intra-bank weight sort operation wherein the assigned weights of a bank of a plurality of banks are sorted within the bank. In an embodiment, the compression engine comprises an address generator to generate bank addresses to be supplied to each bank of a plurality of banks during an intra-bank weight sort operation. In an embodiment, the compression engine comprises an address generator to generate bank addresses to be supplied to each bank of a plurality of banks during an intra-bank weight sort operation and wherein the bank addresses are generated such that an entry of a bank is not accessed in two consecutive cycles. In an embodiment, the compression engine is to perform an inter-bank weight sort operation wherein the inter-bank weight sort operation is to output a lowest weighted first symbol based on a comparison of a second plurality of first symbols, the second plurality of first symbols including a first symbol from each bank of a plurality of banks. In an embodiment, the compression engine comprises a plurality of comparators to perform an intra-bank weight sort for a plurality of banks of the memory and wherein at least a subset of the plurality of comparators are reused to perform an inter-bank weight sort for the plurality of banks. In an embodiment, the compression engine is to store the weights assigned to the first symbols in the memory and weights assigned to a plurality of second symbols of the Huffman tree in a second memory. In an embodiment, the compression engine is to store the weights assigned to the first symbols in the memory; store weights assigned to a plurality of second symbols of the Huffman tree in a second memory; calculate a depth of a first symbol based on an access to the second memory; and overwrite an assigned weight in the memory with the calculated depth. In an embodiment, the compression engine is to identify two lowest weighted first symbols and two lowest weighted second symbols; select two lowest weighted symbols from the identified two lowest weighted first symbols and two lowest weighted second symbols; and form a second symbol of the Huffman tree based on the selected two lowest weighted symbols. In an embodiment, the compression engine is to sort zero-weighted symbols together in a bank of a plurality of banks; and during the creation of the plurality of Huffman codes, stop processing symbols of the bank when a zero-weighted symbol is encountered. In an embodiment, the apparatus further comprises a battery communicatively coupled to a processor, a display communicatively coupled to the processor, or a network interface communicatively coupled to the processor.

In at least one embodiment, a method comprises assigning weights to a plurality of first symbols of a data set, a weight representing a frequency of a corresponding first symbol in the data set; performing a partial sort of the first symbols based on the assigned weights; generating, by a compression engine comprising circuitry, at least a portion of a Huffman tree based on the partial sort; and creating a plurality of Huffman codes for the plurality of first symbols based on the Huffman tree.

In an embodiment, a method further comprises storing the assigned weights among a plurality of banks of a memory. In an embodiment, performing the partial sort comprises performing an intra-bank weight sort operation wherein the assigned weights of a bank of a plurality of banks are sorted within the bank. In an embodiment, a method further comprises generating, by an address generator, bank addresses to be supplied to each bank of a plurality of banks during an intra-bank weight sort operation. In an embodiment, a method further comprises generating, by an address generator, bank addresses to be supplied to each bank of a plurality of banks during an intra-bank weight sort operation and wherein the bank addresses are generated such that an entry of a bank is not accessed in two consecutive cycles. In an embodiment, a method further comprises performing an inter-bank weight sort operation wherein the inter-bank weight sort operation is to output a lowest weighted first symbol based on a comparison of a second plurality of first symbols, the second plurality of first symbols including a first symbol from each bank of a plurality of banks. In an embodiment, a method further comprises performing, by a plurality of comparators, an intra-bank weight sort for a plurality of banks of the memory and wherein at least a subset of the plurality of comparators are reused to perform an inter-bank weight sort for the plurality of banks. In an embodiment, a method further comprises storing the weights assigned to the first symbols in the memory and weights assigned to a plurality of second symbols of the Huffman tree in a second memory. In an embodiment, a method further comprises storing the weights assigned to the first symbols in the memory; storing weights assigned to a plurality of second symbols of the Huffman tree in a second memory; calculating a depth of a first symbol based on an access to the second memory; and overwriting an assigned weight in the memory with the calculated depth. In an embodiment, a method further comprises identifying two lowest weighted first symbols and two lowest weighted second symbols; selecting two lowest weighted symbols from the identified two lowest weighted first symbols and two lowest weighted second symbols; and forming an second symbol of the Huffman tree based on the selected two lowest weighted symbols. In an embodiment, a method further comprises sorting zero-weighted symbols together in a bank of a plurality of banks; and during the creation of the plurality of Huffman codes, stopping processing symbols of the bank when a zero-weighted symbol is encountered.

In at least one embodiment, at least one non-transitory machine readable storage medium comprises instructions stored thereon, the instructions when executed by a machine to cause the machine to assign weights to a plurality of first symbols of a data set, a weight representing a frequency of a corresponding first symbol in the data set; perform a partial sort of the first symbols based on the assigned weights; generate at least a portion of a Huffman tree based on the partial sort; and create a plurality of Huffman codes for the plurality of first symbols based on the Huffman tree.

In an embodiment, performing the partial sort comprises performing an intra-bank weight sort operation wherein the assigned weights of a bank of a plurality of banks are sorted within the bank. In an embodiment, the instructions when executed to cause the machine are to generate, by an address generator, bank addresses to be supplied to each bank of a plurality of banks during an intra-bank weight sort operation. In an embodiment, the instructions when executed are to cause the machine to perform an inter-bank weight sort operation wherein the inter-bank weight sort operation is to output a lowest weighted first symbol based on a comparison of a second plurality of first symbols, the second plurality of first symbols including a first symbol from each bank of a plurality of banks.

In at least one embodiment, a system comprises means for assigning weights to a plurality of first symbols of a data set, a weight representing a frequency of a corresponding first symbol in the data set; means for performing a partial sort of the first symbols based on the assigned weights; means for generating, by a compression engine comprising circuitry, at least a portion of a Huffman tree based on the partial sort; and means for creating a plurality of Huffman codes for the plurality of first symbols based on the Huffman tree.

In an embodiment, performing the partial sort comprises performing an intra-bank weight sort operation wherein the assigned weights of a bank of a plurality of banks are sorted within the bank. In an embodiment, a system comprises means for generating, by an address generator, bank addresses to be supplied to each bank of a plurality of banks during an intra-bank weight sort operation. In an embodiment, a system comprises means for performing an inter-bank weight sort operation wherein the inter-bank weight sort operation is to output a lowest weighted first symbol based on a comparison of a second plurality of first symbols, the second plurality of first symbols including a first symbol from each bank of a plurality of banks.

In at least one embodiment, a system comprises a memory; a processor to request compression of a data set; and a compression engine comprising circuitry, the compression engine to assign weights to a plurality of first symbols of the data set, a weight representing a frequency of a corresponding first symbol in the data set; perform a partial sort of the first symbols based on the assigned weights; generate at least a portion of a Huffman tree based on the partial sort; and create a plurality of Huffman codes for the plurality of first symbols based on the Huffman tree.

In an embodiment, the compression engine is to compress the data set based on the plurality of Huffman codes. In an embodiment, a system further comprises a network interface to transmit the compressed data set onto a network.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
a memory; and a compression engine comprising circuitry, the compression engine to:
assign weights to a plurality of first symbols of a data set, a weight representing a frequency of a corresponding first symbol in the data set;
perform a partial sort of the first symbols based on the assigned weights;
generate at least a portion of a Huffman tree based on the partial sort, wherein the generation of at least a portion of the Huffman tree is performed concurrently with further sorting of at least some of the first symbols; and
create a plurality of Huffman codes for the plurality of first symbols based on the Huffman tree.

2. The apparatus of claim 1, wherein the compression engine is to store the assigned weights among a plurality of banks of the memory.

3. The apparatus of claim 1, wherein performing the partial sort comprises performing an intra-bank weight sort operation wherein the assigned weights of a bank of a plurality of banks are sorted within the bank.

4. The apparatus of claim 1, wherein the compression engine comprises an address generator to generate bank addresses to be supplied to each bank of a plurality of banks during an intra-bank weight sort operation.

5. The apparatus of claim 1, wherein the compression engine comprises an address generator to generate bank addresses to be supplied to each bank of a plurality of banks during an intra-bank weight sort operation and wherein the bank addresses are generated such that an entry of a bank is not accessed in two consecutive cycles.

6. The apparatus of claim 1, wherein the compression engine is to perform an inter-bank weight sort operation wherein the inter-bank weight sort operation is to output a lowest weighted first symbol based on a comparison of a second plurality of first symbols, the second plurality of first symbols including a first symbol from each bank of a plurality of banks.

7. The apparatus of claim 1, wherein the compression engine comprises a plurality of comparators to perform an intra-bank weight sort for a plurality of banks of the memory and wherein at least a subset of the plurality of comparators are reused to perform an inter-bank weight sort for the plurality of banks.

8. The apparatus of claim 1, wherein the compression engine is to store the weights assigned to the first symbols in the memory and weights assigned to a plurality of second symbols of the Huffman tree in a second memory.

9. The apparatus of claim 1, wherein the compression engine is to:
store the weights assigned to the first symbols in the memory;
store weights assigned to a plurality of second symbols of the Huffman tree in a second memory;
calculate a depth of a first symbol based on an access to the second memory; and
overwrite an assigned weight in the memory with the calculated depth.

10. The apparatus of claim 1, wherein the compression engine is to:
identify two lowest weighted first symbols and two lowest weighted second symbols;
select two lowest weighted symbols from the identified two lowest weighted first symbols and two lowest weighted second symbols; and
form a second symbol of the Huffman tree based on the selected two lowest weighted symbols.

11. The apparatus of claim 1, wherein the compression engine is to:
sort zero-weighted symbols together in a bank of a plurality of banks; and
during the creation of the plurality of Huffman codes, stop processing symbols of the bank when a zero-weighted symbol is encountered.

12. The apparatus of claim 1, further comprising a battery communicatively coupled to a processor, a display communicatively coupled to the processor, or a network interface communicatively coupled to the processor.

13. A method comprising:
assigning weights to a plurality of first symbols of a data set, a weight representing a frequency of a corresponding first symbol in the data set;
performing a partial sort of the first symbols based on the assigned weights;
generating, by a compression engine comprising circuitry, at least a portion of a Huffman tree based on the partial sort, wherein the generation of at least a portion of the Huffman tree is performed concurrently with further sorting of at least some of the first symbols; and
creating a plurality of Huffman codes for the plurality of first symbols based on the Huffman tree.

14. The method of claim 13, wherein performing the partial sort comprises performing an intra-bank weight sort operation wherein the assigned weights of a bank of a plurality of banks are sorted within the bank.

15. The method of claim 13, further comprising generating, by an address generator, bank addresses to be supplied to each bank of a plurality of banks during an intra-bank weight sort operation.

16. The method of claim 13, further comprising performing an inter-bank weight sort operation wherein the inter-bank weight sort operation is to output a lowest weighted first symbol based on a comparison of a second plurality of first symbols, the second plurality of first symbols including a first symbol from each bank of a plurality of banks.

17. At least one non-transitory machine readable storage medium having instructions stored thereon, the instructions when executed by a machine to cause the machine to:
assign weights to a plurality of first symbols of a data set, a weight representing a frequency of a corresponding first symbol in the data set;
perform a partial sort of the first symbols based on the assigned weights;
generate at least a portion of a Huffman tree based on the partial sort, wherein the generation of at least a portion of the Huffman tree is performed concurrently with further sorting of at least some of the first symbols; and
create a plurality of Huffman codes for the plurality of first symbols based on the Huffman tree.

18. The at least one medium of claim 17, wherein performing the partial sort comprises performing an intra-bank weight sort operation wherein the assigned weights of a bank of a plurality of banks are sorted within the bank.

19. The at least one medium of claim 17, the instructions when executed to cause the machine to generate, by an address generator, bank addresses to be supplied to each bank of a plurality of banks during an intra-bank weight sort operation.

20. The at least one medium of claim 17, the instructions when executed to cause the machine to perform an inter-bank weight sort operation wherein the inter-bank weight sort operation is to output a lowest weighted first symbol based on a comparison of a second plurality of first symbols, the second plurality of first symbols including a first symbol from each bank of a plurality of banks.

21. A system comprising:
   a memory;
   a processor to request compression of a data set; and
   a compression engine comprising circuitry, the compression engine to:
      assign weights to a plurality of first symbols of the data set, a weight representing a frequency of a corresponding first symbol in the data set;
      perform a partial sort of the first symbols based on the assigned weights;
      generate at least a portion of a Huffman tree based on the partial sort, wherein the generation of at least a portion of the Huffman tree is performed concurrently with further sorting of at least some of the first symbols; and
      create a plurality of Huffman codes for the plurality of first symbols based on the Huffman tree.

22. The system of claim 21, the compression engine further to compress the data set based on the plurality of Huffman codes.

23. The system of claim 22, further comprising a network interface to transmit the compressed data set onto a network.

* * * * *